US012094817B2

(12) United States Patent
Kang et al.

(10) Patent No.: US 12,094,817 B2
(45) Date of Patent: *Sep. 17, 2024

(54) SEMICONDUCTOR PACKAGE

(71) Applicant: SAMSUNG ELECTRONICS CO., LTD., Suwon-si (KR)

(72) Inventors: Myungsam Kang, Hwaseong-si (KR); Youngchan Ko, Seoul (KR); Kyungdon Mun, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/125,529

(22) Filed: Mar. 23, 2023

(65) Prior Publication Data
US 2023/0230917 A1     Jul. 20, 2023

Related U.S. Application Data

(63) Continuation of application No. 16/988,831, filed on Aug. 10, 2020, now Pat. No. 11,626,367.

(30) Foreign Application Priority Data

Jan. 3, 2020    (KR) ........................ 10-2020-0000865

(51) Int. Cl.
*H01L 23/522*     (2006.01)
*H01L 23/00*     (2006.01)
(Continued)

(52) U.S. Cl.
CPC .......... *H01L 23/5226* (2013.01); *H01L 23/31* (2013.01); *H01L 23/36* (2013.01);
(Continued)

(58) Field of Classification Search
CPC ..... H01L 23/5226; H01L 24/14; H01L 24/19; H01L 24/20; H01L 23/3128; H01L 23/5389
See application file for complete search history.

(56) References Cited

U.S. PATENT DOCUMENTS 9,269,595 B2    2/2016   Chi et al.
10,224,254 B2    3/2019   Chen et al.
(Continued)

FOREIGN PATENT DOCUMENTS

JP          5895467 B2    3/2016
JP          5942823 B2    6/2016

*Primary Examiner* — Phat X Cao
(74) *Attorney, Agent, or Firm* — Sughrue Mion, PLLC

(57) ABSTRACT

A semiconductor package includes a redistribution substrate including a first redistribution layer; a semiconductor chip having a connection pad connected to the first redistribution layer; a vertical connection conductor electrically connected to the connection pad by the first redistribution layer; a core member having a first through-hole accommodating the semiconductor chip and a second through-hole accommodating the vertical connection conductor; an encapsulant filling the first and second through-holes; and a redistribution member including a second redistribution layer. The vertical connection conductor and the core member include a same material. A width of a lower surface of the vertical connection conductor is wider than that of an upper surface thereof, a width of a lower end of the first through-hole is narrower than that of an upper end thereof, and a width of a lower end of the second through-hole is narrower than that of an upper end thereof.

20 Claims, 19 Drawing Sheets

(51) Int. Cl.
    *H01L 23/31*           (2006.01)
    *H01L 23/36*           (2006.01)

(52) U.S. Cl.
    CPC .............. *H01L 24/14* (2013.01); *H01L 24/19* (2013.01); *H01L 24/20* (2013.01)

(56) References Cited

U.S. PATENT DOCUMENTS

| | | |
|---|---|---|
| 10,256,114 B2 | 4/2019 | Huemoeller et al. |
| 10,325,891 B1 | 6/2019 | Lim et al. |
| 10,388,598 B2 | 8/2019 | Lu et al. |
| 10,903,169 B2 * | 1/2021 | Huang ................ H01L 23/5386 |
| 11,626,367 B2 * | 4/2023 | Kang ..................... H01L 24/20 |
| | | 257/774 |
| 2006/0255440 A1 | 11/2006 | Miyazaki et al. |
| 2010/0006330 A1 | 1/2010 | Fu et al. |
| 2013/0113091 A1 | 5/2013 | Meng et al. |
| 2013/0320530 A1 | 12/2013 | Koey et al. |
| 2016/0322332 A1 | 11/2016 | Kim et al. |
| 2019/0088566 A1 | 3/2019 | Ha et al. |
| 2019/0378795 A1 | 12/2019 | Lee et al. |

\* cited by examiner

A-A'

A - A'

SEMICONDUCTOR PACKAGE

CROSS-REFERENCE TO RELATED APPLICATION(S)

This application is a Continuation application of U.S. application Ser. No. 16/988,831 filed on Aug. 10, 2020, which claims priority from Korean Patent Application No. 10-2020-0000865 filed on Jan. 3, 2020 in the Korean Intellectual Property Office, the disclosures of each which being incorporated by reference herein in their entireties.

BACKGROUND

1. Field

Devices and apparatuses consistent with the present disclosure related to a semiconductor package.

2. Description of Related Art

Recently, as a semiconductor chip has increased in terms of performance, interest in a semiconductor package having improved stiffness and heat dissipation has increased. If a separate structure (for example, a printed circuit board) is embedded in the package to improve the stiffness of the semiconductor package, there may be disadvantages in which the manufacturing process becomes more complicated and the costs thereof increase. Additionally, a yield of the package may be lowered due to fine foreign matter generated in an operation of processing the separate structure.

SUMMARY

It is an aspect to provide a semiconductor package having excellent stiffness and improved warpage and heat dissipation characteristics.

According to an aspect of an embodiment, there is provided a semiconductor package comprising a redistribution substrate having a first surface and a second surface, opposing the first surface, the redistribution substrate including a first redistribution layer; a semiconductor chip disposed on the first surface of the redistribution substrate and having a connection pad connected to the first redistribution layer; a vertical connection conductor disposed on the first surface of the redistribution substrate and electrically connected to the connection pad by the first redistribution layer; a core member having a first through-hole accommodating the semiconductor chip and a second through-hole accommodating the vertical connection conductor; an encapsulant disposed on the first surface of the redistribution substrate, covering the semiconductor chip, and filling the first through-hole and the second through-hole; and a redistribution member disposed on the encapsulant, and including a second redistribution layer electrically connected to the vertical connection conductor, wherein the vertical connection conductor and the core member comprise a same material, a width of a lower surface of the vertical connection conductor is wider than a width of an upper surface of the vertical connection conductor, a width of a lower end of the first through-hole is narrower than a width of an upper end of the first through-hole, and a width of a lower end of the second through-hole is narrower than a width of an upper end of the second through-hole.

According to another aspect of an embodiment, there is provided a semiconductor package comprising a redistribution substrate including a first redistribution layer; a semiconductor chip disposed on the redistribution substrate and connected to the first redistribution layer; a vertical connection conductor disposed on the redistribution substrate and electrically connected to the semiconductor chip by the first redistribution layer; a core member having a first through-hole accommodating the semiconductor chip and a second through-hole accommodating the vertical connection conductor; and an encapsulant covering at least a portion of the semiconductor chip, at least a portion of the vertical connection conductor, and at least a portion of the core member, the encapsulant filling the first through-hole and the second through-hole, wherein the vertical connection conductor has a cross-sectional shape in which a side surface of the vertical connection conductor is tapered, such that a width of a lower surface of the vertical connection conductor is wider than a width of an upper surface of the vertical connection conductor, and each of the first through-hole and the second through-hole has a cross-sectional shape tapered in a tapering direction opposing a tapering direction of the vertical connection conductor.

According to yet another aspect of an embodiment, there is provided a semiconductor package comprising a redistribution substrate including a first redistribution layer; a semiconductor chip disposed on the redistribution substrate and having a connection pad connected to the first redistribution layer; a vertical connection conductor disposed on the redistribution substrate, spaced apart from the semiconductor chip, and electrically connected to the connection pad by the first redistribution layer; a core member having a first through-hole accommodating the semiconductor chip and a second through-hole accommodating the vertical connection conductor; an encapsulant disposed on the redistribution substrate, filling the first through-hole and the second through-hole, and covering an upper surface of the semiconductor chip and an outer side surface of the core member; and a redistribution member disposed on an upper surface of the encapsulant and having a second redistribution layer electrically connected to the vertical connection conductor, wherein a lower surface of the encapsulant is coplanar with a lower surface of the vertical connection conductor and a lower surface of the core member, a planar area of the lower surface of the vertical connection conductor is greater than a planar area of an upper surface of the vertical connection conductor, and a planar area of the lower surface of the core member is greater than a planar area of an upper surface of the core member.

BRIEF DESCRIPTION OF DRAWINGS

The above and other aspects will be more clearly understood from the following detailed description, taken in conjunction with the accompanying drawings, in which.

DETAILED DESCRIPTION

Hereinafter, various embodiments will be described with reference to the accompanying drawings.

Figure 1:
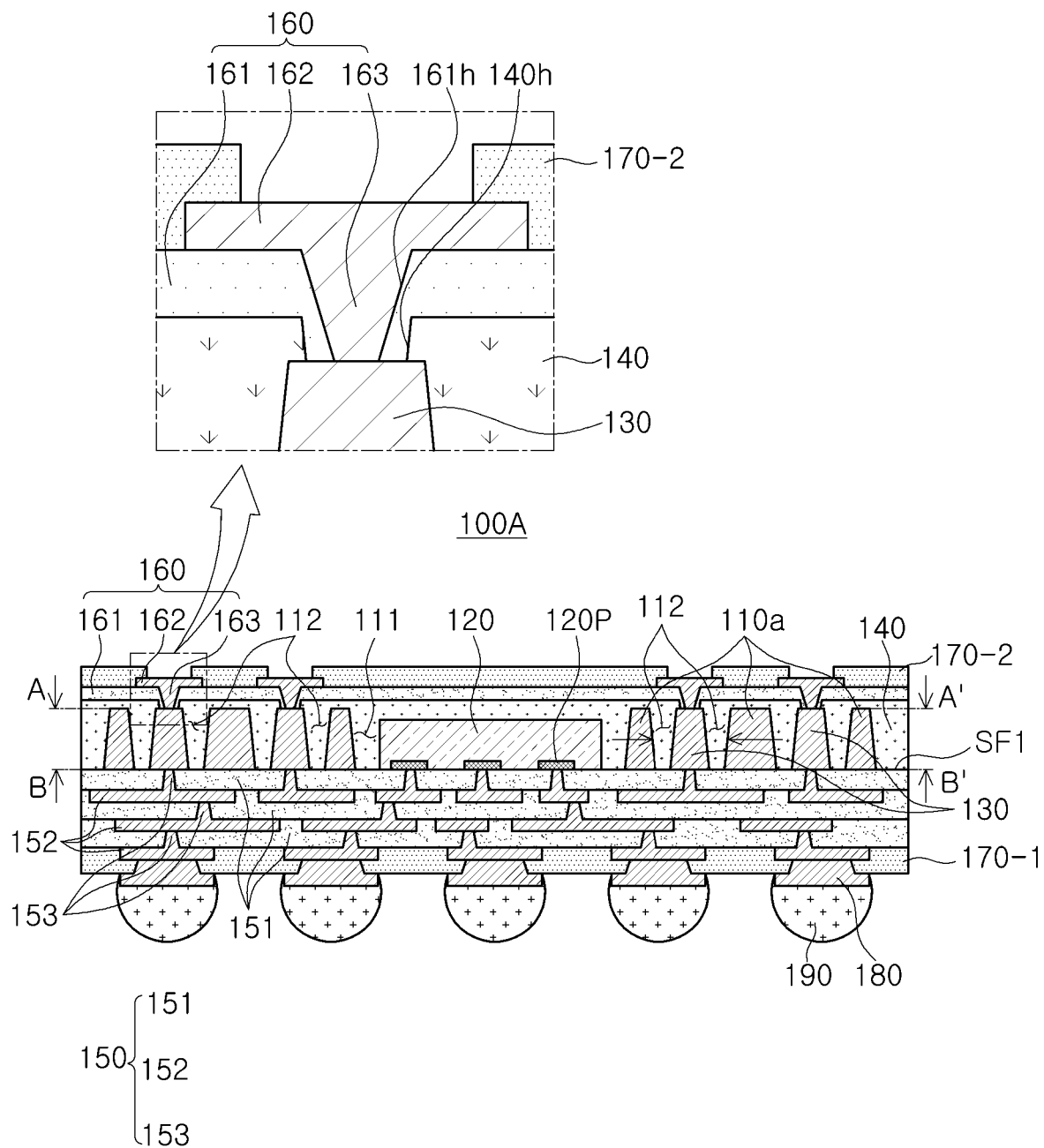
FIG. 1 is a cross-sectional view illustrating a semiconductor package according to an embodiment.
Figure 2A:
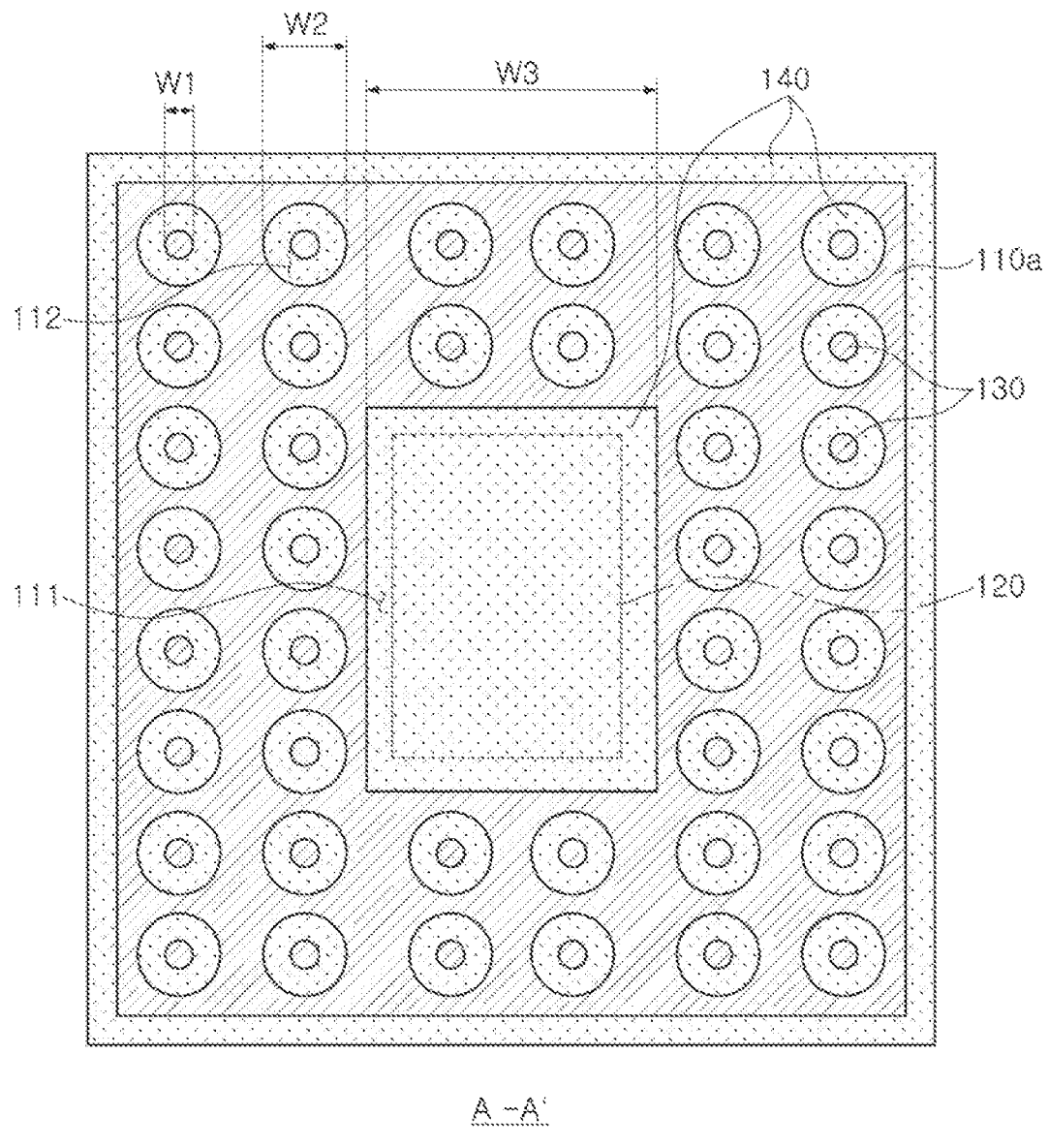
FIGS. 2A and 2B are plan views illustrating cross-sectional views taken along lines A-A' and B-B' of the semiconductor package of FIG. 1, respectively, according to various embodiments.
Figure 2B:
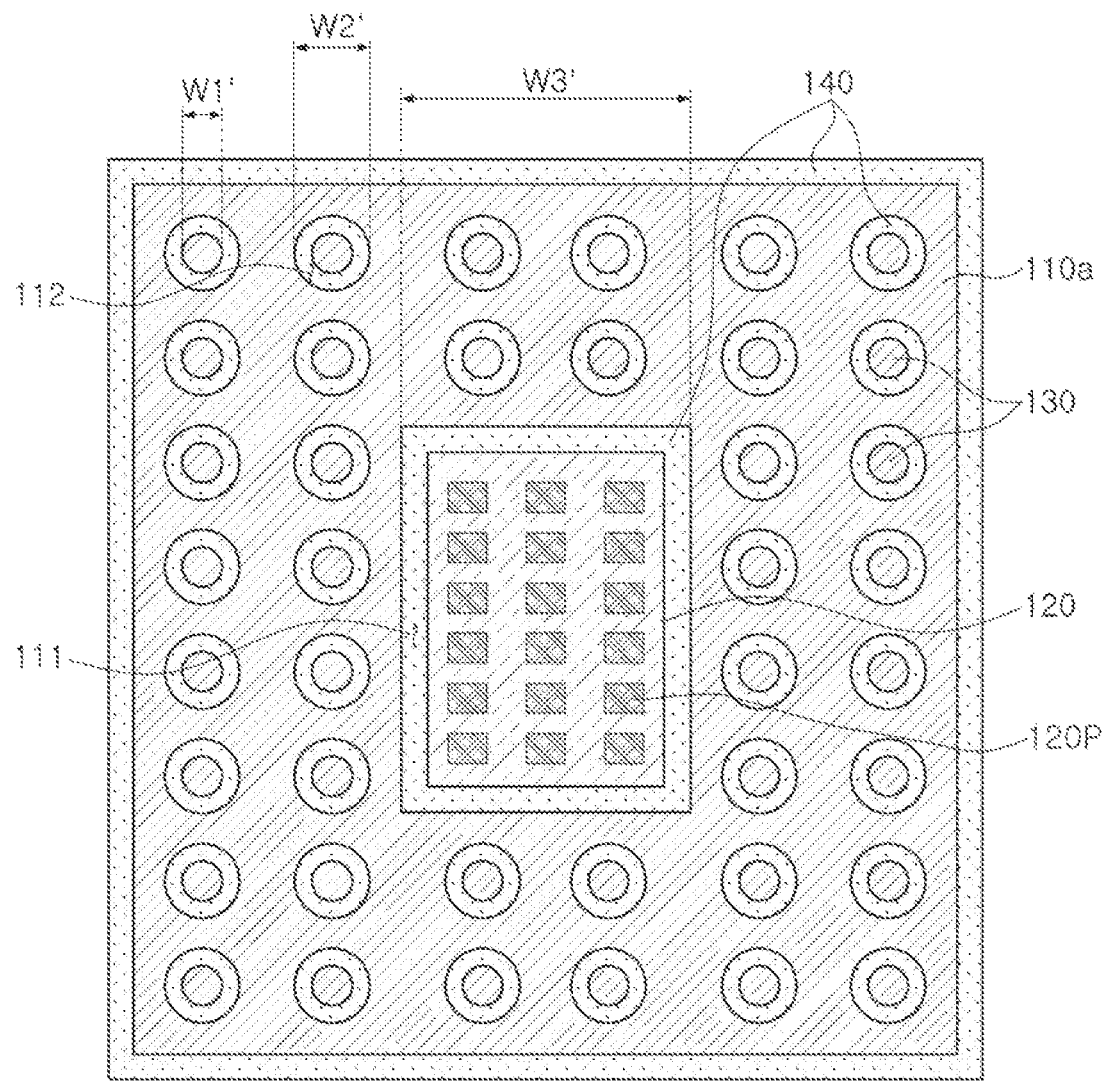

FIG. 1 is a cross-sectional view illustrating a semiconductor package according to an embodiment, FIG. 2A is a plan view illustrating a cross-sectional view taken along line A-A' of the semiconductor package of FIG. 1, when viewed in an upward direction, and FIG. 2B is a plan view illustrating a cross-sectional view taken along line B-B' of the semiconductor package of FIG. 1, when viewed in a downward direction.

Referring to FIGS. 1, 2A, and 2B, a semiconductor package 100A may include a core member 110a, a semiconductor chip 120, a vertical connection conductor 130, an encapsulant 140, a redistribution substrate 150, and a redistribution member 160. In addition, the semiconductor package 100A may further include passivation layers 170-1 and 170-2, an under-bump metal 180, and a connection bump 190.

The core member 110a may include a body having a plate shape having a thickness greater than or equal to a thickness of the semiconductor chip 120, a first through-hole 111 passing through the body and in which the semiconductor chip 120 is disposed, and a second through-hole 112 in which the vertical connection conductor 130 is disposed. For example, the second through-hole 112 may extend between adjacent portions of the core member 110a, as illustrated in FIG. 1. The first through-hole 111 may be formed in a central portion (e.g., a fan-in region) of the core member 110a, and the second through-hole 112 may be formed in an outer portion (e.g., a fan-out region) of the core member 110a. The first and second through-holes 111 and 112 may be formed by etching the body (CM of FIG. 4A) of the core member 110a having a plate shape. Therefore, an outer side surface of the core member 110a may have a vertical cross-sectional shape tapered with respect to a center of the core member 110a, and inner side surfaces of the core member 110a, which may be side wall surfaces of the first and second through-holes 111 and 112, may have a vertical cross-sectional shape tapered with respect to a center of the first and second through-holes 111 and 112 (see FIGS. 4A and 4B discussed below). The first and second through-holes 111 and 112 may have vertical cross-sectional shapes in which the side wall surfaces thereof are tapered. For example, a width (W3' of FIG. 2B) of a lower end of the first through-hole 111 may be narrower than a width (W3 of FIG. 2A) of an upper end of the first through-hole 111, and a width (W2' of FIG. 2B) of a lower end of the second through-hole 112 may be narrower than a width (W2 of FIG. 2A) of an upper end of the second through-hole 112. In addition, a planar area of a lower surface of the core member 110a may be greater than a planar area of an upper surface of the core member 110a. The width (W3' of FIG. 2B) of the lower end of the first through-hole 111 may be the sum of a width of the semiconductor chip 120 and spaced distances between both ends of the semiconductor chip 120 facing each other and respective edges of the lower end of the first through-hole 111, and each of the spaced distances may be about 30 μm, such that the total of both spaced distances is 60 μm. The width (W3 of FIG. 2A) of the upper end of the first through-hole 111 may be the sum of a width of the semiconductor chip 120 and spaced distances between both ends of the semiconductor chip 120 facing each other and respective edges of the upper end of the first through-hole 111, and each of the spaced distances may be about 55 μm, such that the total of both spaced distances is about 110 μm. The width (W2' of FIG. 2B) of the lower end of the second through-hole 112 may be the sum of a width of a lower portion of the vertical connection conductor 130, corresponding thereto, and spaced distances between both ends of the vertical connection conductor 130 facing each other and respective edges of the lower end of the second through-hole 112, and each of the spaced distances may be about 30 μm, such that the total of both spaced distances is 60 μm. The width (W2 of FIG. 2A) of the upper end of the second through-hole 112 may be the sum of a width of an upper portion of the vertical connection conductor 130, corresponding thereto, and spaced distances between both ends of the vertical connection conductor 130 facing each other and respective edges of the upper end of the second through-hole 112, and each of the spaced distances may be about 80 μm, such that the total of both spaced distances is about 160 μm.

The core member 110a may improve stiffness of the semiconductor package 100A and may control warpage. In addition, heat generated in the semiconductor chip 120 may be discharged to the outside of the package 100A through the core member 110a. The core member 110a may include a metal material, for example, copper (Cu), but embodiments are not limited thereto. In some embodiments, the core member 110a may also include other metal materials, for example, aluminum (Al), silver (Ag), tin (Sn), gold (Au), nickel (Ni), lead (Pb), titanium (Ti), alloys thereof, or the like. The core member 110a may be used as a ground GND for the semiconductor chip 120, or may be used as a dummy pattern.

The vertical connection conductor 130 may be disposed on a first surface SF1 of the redistribution substrate 150, and may be electrically connected to a connection pad 120P of the semiconductor chip 120 by a first redistribution layer 152. The vertical connection conductor 130 may include the same material as the core member 110a, and may have an island structure electrically insulated from the core member 110a by the encapsulant 140 filling the second through-hole 112 of the core member 110a. The vertical connection conductor 130 may be formed together with the through-holes 111 and 112 of the core member 110a. Therefore, the vertical connection conductor 130 may have a vertical cross-sectional shape in which a side surface connecting a lower surface and an upper surface thereof is tapered. For example, the side surface of the vertical connection conductor 130 may have a vertical cross-sectional shape tapered about a center of the vertical connection conductor 130, and the width (W1' of FIG. 2B) of the lower surface of the vertical connection conductor 130 may be greater than the width (W1 of FIG. 2A) of the upper surface of the vertical connection conductor 130. The width (W1' of FIG. 2B) of the lower surface of the vertical connection conductor 130 may be about 100ρM to 340 μm, and the width (W1 of FIG. 2A) of the upper surface of the vertical connection conductor 130 may be about 60ρM to 240 μm. A side surface of the core member 110a may have a cross-sectional shape tapered in the same directions as the vertical connection conductor 130, and each of the first and second through-holes 111 and 112 may have a cross-sectional shape tapered in directions, opposing directions tapering in the vertical connection conductor 130. In addition, a planar area of the lower surface of the vertical connection conductor 130 may be greater than a planar area of the upper surface of the vertical connection conductor 130.

Figure 2C:
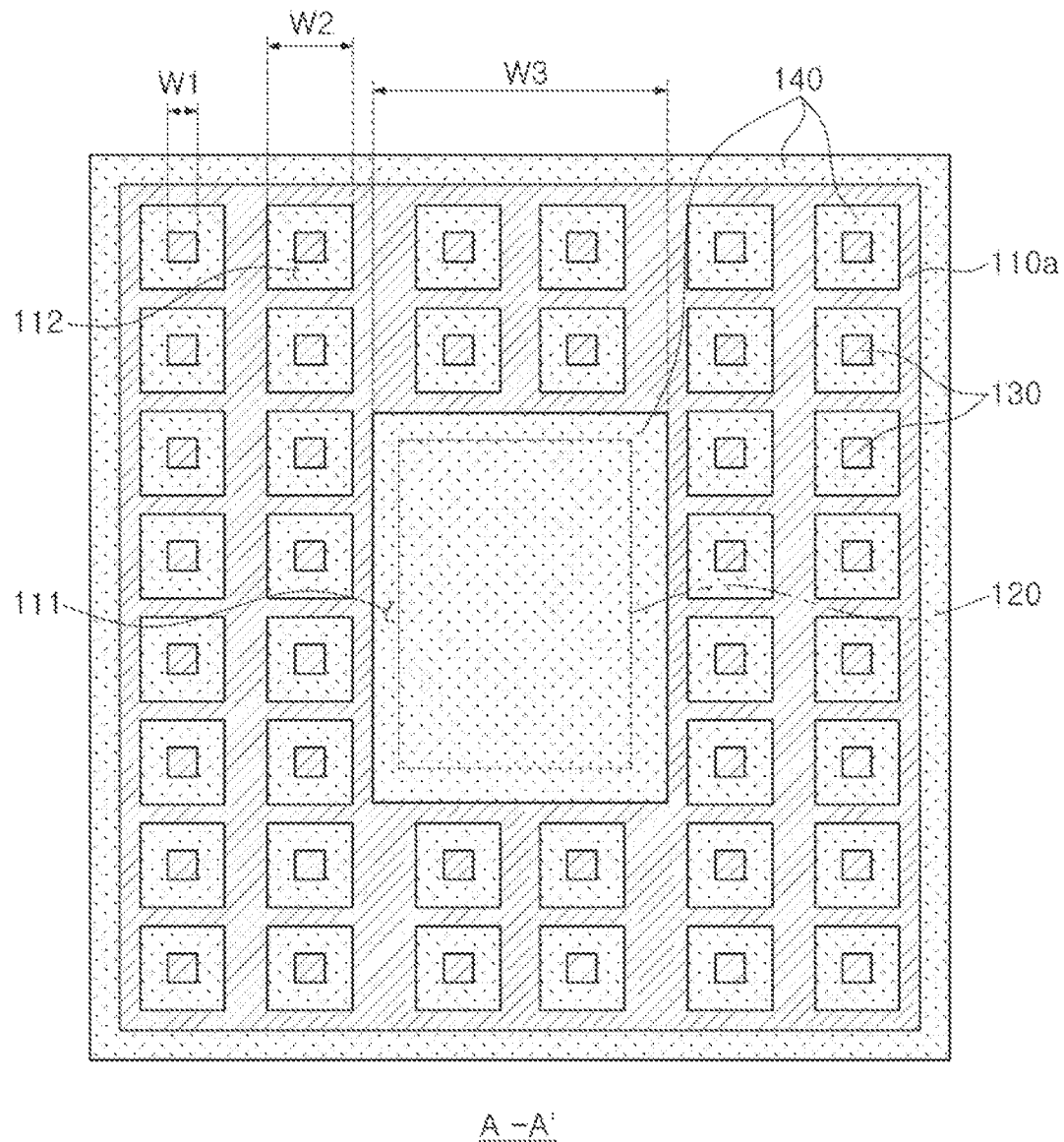
FIGS. 2C and 2D are plan views illustrating modified examples of FIGS. 2A and 2B, respectively, according to various embodiments.
Figure 2D:
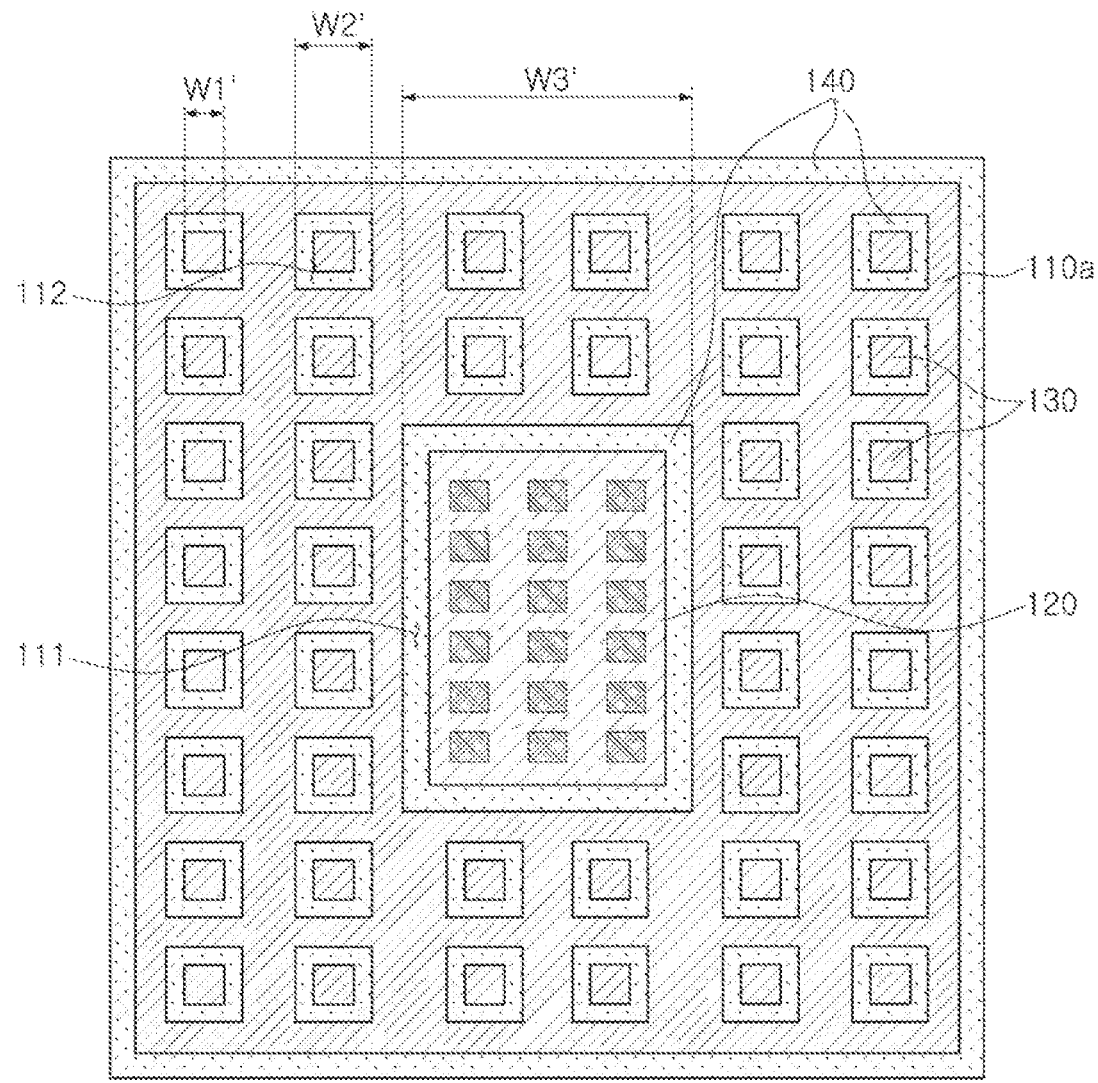

A horizontal cross-sectional shape (a cross-sectional shape in plan view) of the vertical connection conductor 130 is not particularly limited. For example, as illustrated in FIGS. 2A and 2B, the horizontal cross-sectional shape of the vertical connection conductors 130 may have a circular shape in some embodiments. However, in other embodiments, the horizontal cross-sectional shape of the vertical connection conductors 130 may have various shapes such as an ellipse, a rectangle, or the like. For example, as in the modified example illustrated in FIGS. 2C and 2D, the horizontal cross-sectional shape of the vertical connection conductors 130 may have a rectangular shape. The horizontal cross-sectional shape of the vertical connection conductors 130, and a horizontal cross-sectional shape of the second through-holes 112 accommodating the vertical connection conductors 130 may have similar shapes.

In an embodiment, the vertical connection conductors 130 may include a plurality of vertical connection conductors 130 spaced apart from each other, and the core member 110a may have a plurality of second through-holes 112 respectively accommodating the plurality of vertical connection conductors 130, and the plurality of second through-holes 112 may be spaced apart from each other.

The vertical connection conductor 130 may provide an electrical connection path connecting upper and lower components of the package 100A. The vertical connection conductor 130 may be spaced apart from and isolated from the side wall surface of the second through-hole 112 in the second through-hole 112. The vertical connection conductor 130 may be connected to a first redistribution via 153 of the redistribution substrate 150 and a second redistribution via 163 of the redistribution member 160. A package-on-package structure in which another package is bonded to an upper portion of the package 100A by the vertical connection conductor 130 may be easily implemented. The vertical connection conductor 130 may include a metal material, for example, copper (Cu), such as the core member 110a, but embodiment are not limited thereto. In some embodiments, the vertical connection conductor 130 may also include other metal materials, for example, aluminum (Al), silver (Ag), tin (Sn), gold (Au), nickel (Ni), lead (Pb), titanium (Ti), alloys thereof, or the like. The vertical connection conductor 130 may be used as a signal pattern for the semiconductor chip 120.

In general in the related art, in order to reinforce weaknesses of a molding material covering the semiconductor chip in the semiconductor package (low stiffness, low heat dissipation, etc.), a conductive structure for improving stiffness or/and an insulating structure for improving heat dissipation and warpage characteristics and forming an electrical connection path may be arranged in the package. When several process operations are applied to a manufacturing process and a processing process of structures embedded in the package, time and costs of manufacturing the package itself may be increased, and a yield of the package may be lowered.

Various embodiments disclosed herein may improve stiffness and warpage characteristics and heat dissipation characteristics of the package while minimizing the additional process of the package by etching a metal plate to simultaneously manufacture a core member improving stiffness and warpage characteristics of the package and a vertical connection conductor forming an electrical path in the package. Therefore, in various embodiments, the core member 110a and the vertical connection conductor 130 may include the same metal material as each other, and side surfaces (inner and outer side surfaces) of the core member 110a and a side surface of the vertical connection conductor 130 may have a tapered vertical cross-sectional shape, respectively.

The semiconductor chip 120 may be disposed on the first surface of the redistribution substrate 150, and may have a connection pad 120P electrically connected to the first redistribution layer 152 of the redistribution substrate 150.

The semiconductor chip 120 may be an integrated circuit (IC) in a bare state in which no bumps or wiring layers are formed. However, embodiments are not limited thereto. In some embodiments, the semiconductor chip 120 may be a packaged integrated circuit. The integrated circuit may be formed based on an active wafer. The semiconductor chip 120 may include silicon (Si), germanium (Ge), or gallium arsenide (GaAs) to form various types of integrated circuits. The integrated circuit may be a processor chip such as a central processor (e.g., CPU), a graphics processor (e.g., GPU), a field programmable gate array (FPGA), an application processors (AP), a digital signal processor, a cryptographic processor, a microprocessor, a microcontroller, and the like, but embodiments are not limited thereto. In some embodiments, the integrated circuit may be a logic chip such as an analog-digital converter and an application-specific IC (ASIC), or may be a memory chip such as a volatile memory (e.g., DRAM), and a non-volatile memory (e.g., a ROM and a flash memory), but embodiments are not limited thereto.

The connection pad 120P may electrically connect the semiconductor chip 120 to other components. The connection pad 120P may include a conductive material, for example, aluminum (Al), but embodiments are not limited thereto, and in some embodiments, the connection pad 120P may include other types of conductive materials without any limitation thereon.

The encapsulant 140 may be disposed on the first surface SF1 of the redistribution substrate 150, and may encapsulate at least a portion of the core member 110a, at least a portion of the vertical connection conductor 130, and at least a portion of the semiconductor chip 120. A space between the semiconductor chip 120 and the side wall surface of the first through-hole 111 and a space between the vertical connection conductors 130 and the side wall surfaces of the second through-holes 112 may be filled with the encapsulant 140. Since the encapsulant 140 may cover the outer side surface of the core member 110a, the core member 110a may not be exposed from the package 100A externally. A lower surface of the encapsulant 140 may be coplanar with the lower surface of the vertical connection conductor 130 and the lower surface of the core member 110a.

In some embodiments, the upper surface of the vertical connection conductor 130 and the upper surface of the core member 110a may be on a level higher than an upper surface of the semiconductor chip 120, the encapsulant 140 may cover the upper surface of the vertical connection conductor 130 and the upper surface of the core member 110a, and an upper surface of the encapsulant 140 may be on a level higher than the upper surface of the vertical connection conductor 130 and the upper surface of the core member 110a. The upper surface of the encapsulant 140 may be spaced apart from the upper surface of the vertical connection conductor 130 and the upper surface of the core member 110a by a predetermined distance.

The encapsulant 140 may include an insulating material, for example, Ajinomoto Build-up Film (ABF), but embodiments are not particularly limited, and in some embodiments the encapsulant 140 may include other insulating materials. For example, the encapsulant 140 may include a thermosetting resin such as an epoxy resin, a thermoplastic resin such as polyimide, or a resin including a reinforcing material such as an inorganic filler, specifically ABF, FR-4, BT, resin, or the like. In addition, molding materials such as an epoxy molding compound (EMC) or photosensitive materials such as a photoimageable dielectric (PID) may be used.

The redistribution substrate 150 may have a first surface on which the core member 110a, the vertical connection conductor 130, and the semiconductor chip 120 are arranged, and a second surface, opposing the first surface, and may include a first redistribution layer 152 electrically connecting the connection pad 120P of the semiconductor chip 120 and the vertical connection conductor 130. The redistribution substrate 150 may include a first insulating layer 151 on a plane in which the lower surface of the encapsulant 140, the lower surface of the vertical connection conductor 130, and the lower surface of the core member 110a are coplanar, the first redistribution layer 152 on the first insulating layer 151, and a first redistribution via 153 passing through the first insulating layer 151 to connect the first redistribution layer to the vertical connection conductor 130 and the connection pad 120P of the semiconductor chip 120.

The redistribution substrate 150 may redistribute the connection pads 120P of the semiconductor chip 120, and may include the first insulating layer 151, the first redistribution layer 152, and the first redistribution via 153. It is noted that only a small number of the first insulating layer 151, the first redistribution layer 152, and the first redistribution via 153 are illustrated in the drawings for clarity and conciseness, but in practice a larger number than those illustrated are provided. The first insulating layer 151 may include an insulating material. For example, the first insulating layer 151 may include a photosensitive insulating material such as PID. In this case, since a fine pitch by a photolithography process may be implemented, the connection pad 120P of the semiconductor chip 120 may be effectively redistributed. The insulating material included in the first insulating layer 151 is not limited thereto, and in some embodiments may include other types of insulating materials. The first insulating layer 151 may include the same insulating material as the encapsulant 140 or may include other types of insulating material.

The first redistribution layer 152 may include a conductive material, for example, copper (Cu), aluminum (Al), silver (Ag), tin (Sn), gold (Au), nickel (Ni), lead (Pb), titanium (Ti), or alloys thereof. The first redistribution layer 152 may perform various functions, depending on a design thereof. For example, a ground (GND) pattern, a power (PWR) pattern, a signal (S) pattern, and the like may be included. In this case, the signal (S) pattern may transfer various signals except for the ground (GND) pattern, the power (PWR) pattern, and the like, for example, a data signal, and the like.

The first redistribution via 153 may electrically connect the first redistribution layers 152 having different levels to each other, and may also electrically connect the connection pads 120P and the vertical connection conductors 130 of the semiconductor chip 120 to the first redistribution layer 152. The first redistribution via 153 may be directly connected to the connection pad 120P of the semiconductor chip 120, but embodiments are not limited thereto, and in some embodiments, the first redistribution via 153 may be connected to the connection pad 120P by a solder or a metal pillar. The first redistribution via 153 may include a conductive material, for example, copper (Cu), aluminum (Al), silver (Ag), tin (Sn), gold (Au), nickel (Ni), lead (Pb), titanium (Ti), or alloys thereof. The first redistribution via 153 may be a filled via fully filled with a conductive material, or may be a conformal via in which the conductive material is disposed along a wall surface of a via hole. The first redistribution via 153 may have a shape having a tapered side surface, an hourglass shape, or a cylindrical shape. The first redistribution via 153 may be integrated with the first redistribution layer 152, but embodiments are not limited thereto.

The redistribution member 160 (or rear redistribution member) may include a second insulating layer 161 on the encapsulant 140, a second redistribution layer 162 on the second insulating layer 161, and a second redistribution via 163 passing through the second insulating layer 161 to connect the second redistribution layer 162 and the vertical connection conductor 130. The redistribution member 160 may include the second insulating layer 161, the second redistribution layer 162, and the second redistribution via 163. It is noted that only a small number of the second insulating layer 161, the second redistribution layer 162, and the second redistribution via 163 are illustrated in the drawings for clarity and conciseness, but in practice a larger number than those illustrated are provided.

In an embodiment, the encapsulant 140 may have a first via hole 140h exposing a portion of the upper surface of the vertical connection conductor 130, and the redistribution member 160 may include the second insulating layer 161 disposed on the upper surface of the encapsulant 140 and having a second via hole 161h disposed in the first via hole 140h and exposing a portion of the upper surface of the vertical connection conductor 130, the second redistribution layer 162 on the second insulating layer 161, and the second redistribution via 163 filling the second via hole 161h and connecting the second redistribution layer 162 and the vertical connection conductor 130. Side wall surfaces of the first and second via holes 140h and 161h may be spaced apart from each other.

The second insulating layer 161 may include an insulating material. For example, the second insulating layer 161 may include a photosensitive insulating material such as PID. In this case, a fine pitch by a photolithography process may be implemented. The insulating material included in the second insulating layer 161 is not limited thereto, and in some embodiments the insulating material may include other types of insulating materials. The second insulating layer 161 may include the same insulating material as the first insulating layer 151 of the redistribution substrate 150, or may include other types of insulating material.

At least a portion of the second redistribution layer 162 may be exposed from the upper portion of the package 100A, and may be physically/electrically coupled to another electronic component provided outside the package 100A.

The second redistribution layer 162 may include a conductive material, for example, copper (Cu), aluminum (Al), silver (Ag), tin (Sn), gold (Au), nickel (Ni), lead (Pb), titanium (Ti), or alloys thereof. The second redistribution layer 162 may perform various functions, depending on a design thereof. For example, a ground (GND) pattern, a power (PWR) pattern, a signal (S) pattern, and the like may be included.

The second redistribution via 163 may electrically connect the second redistribution layer 162 to the vertical connection conductor 130. The second redistribution via 163 may include a conductive material, for example, copper (Cu), aluminum (Al), silver (Ag), tin (Sn), gold (Au), nickel (Ni), lead (Pb), titanium (Ti), or alloys thereof. The second redistribution via 163 may be a filled via fully filled with a conductive material, or may be a conformal via in which the conductive material is disposed along a wall surface of a via hole. The second redistribution via 163 may have a shape having a tapered side surface, an hourglass shape, or a cylindrical shape. The second redistribution via 163 may be integrated with the second redistribution layer 162, but embodiments are not limited thereto.

The passivation layers 170-1 and 170-2 may include a first passivation layer 170-1 disposed on the redistribution substrate 150 and a second passivation layer 170-2 disposed on the redistribution member 160. The first passivation layer 170-1 may be disposed on the second surface of the redistribution substrate 150, and may have an opening exposing a portion of the first redistribution layer 152. The second passivation layer 170-2 may be disposed on an upper surface of the redistribution member 160 and may have an opening exposing a portion of the second redistribution layer 162. The passivation layers 170-1 and 170-2 may include an insulating material, for example, ABF, but embodiments are not limited thereto, and in some embodiments the insulating material may include other types of insulating materials.

The under-bump metal 180 may be disposed in the opening of the first passivation layer 170-1, and may be electrically connected to a portion of the first redistribution layer 152 exposed by the opening of the first passivation layer 170-1. The under-bump metal 180 may improve connection reliability of the connection bump 190 and board level reliability of the package 100A. The under-bump metal 180 may be formed by a metallization process using a metal, but is not limited thereto.

The connection bump 190 may be disposed on the first passivation layer 170-1, and may be electrically connected to the first redistribution layer 152 through the under-bump metal 180. The connection bump 190 may physically and/or electrically connect the semiconductor package 100A to external components. The connection bump 190 may include a low melting metal, for example, tin (Sn) or an alloy (Sn—Ag—Cu) including tin (Sn). The connection bump 190 may be a land, a ball, or a pin. The connection bump 190 may include a copper pillar or a solder. At least one of the connection bumps 190 may be disposed in a fan-out region. The fan-out region refers to a region not overlapping a region in which the semiconductor chip 120 is disposed.

Figure 3A:
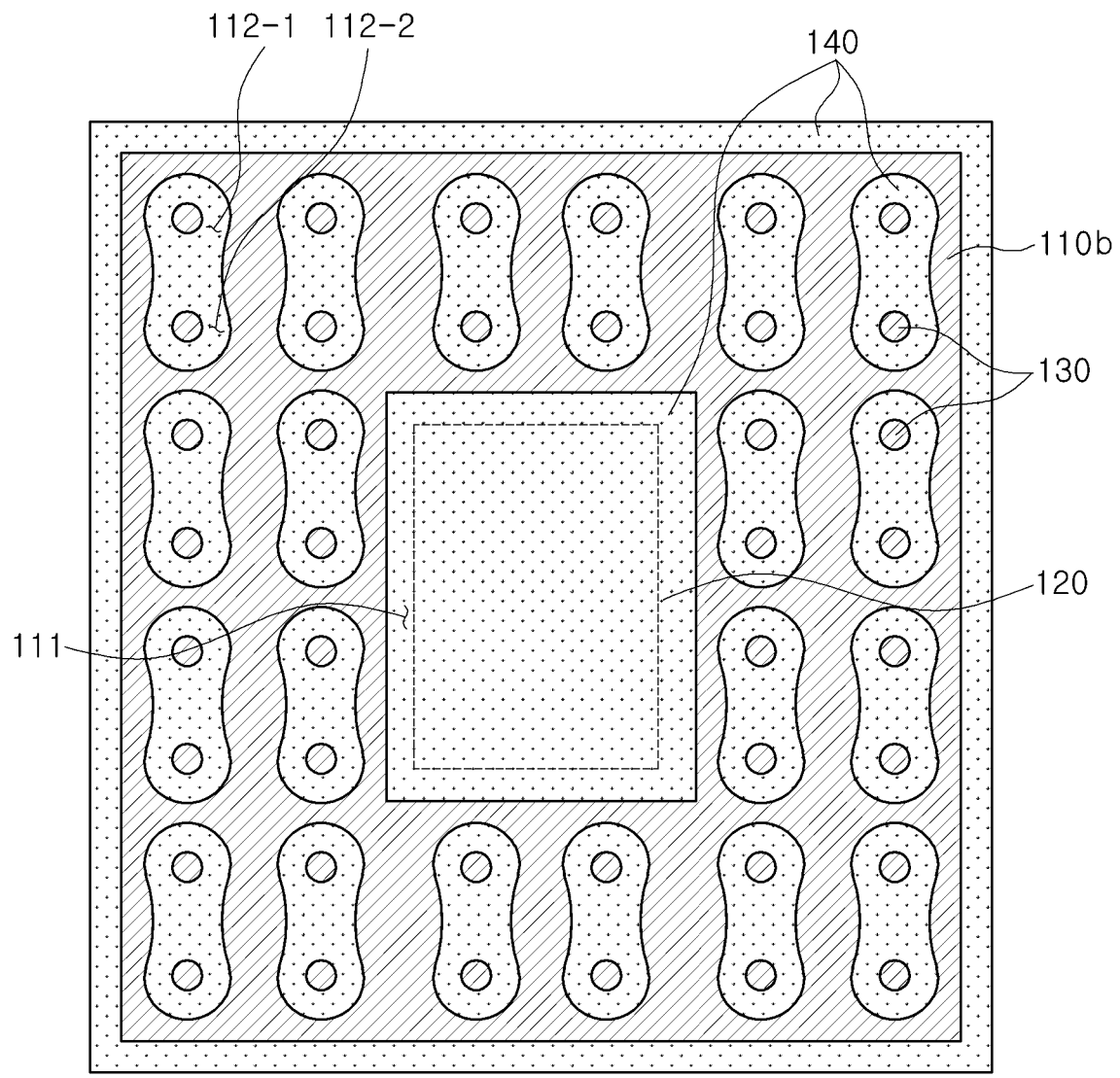
FIGS. 3A and 3B are plan views illustrating further embodiments of some components of the semiconductor package of FIG. 1.
Figure 3B:
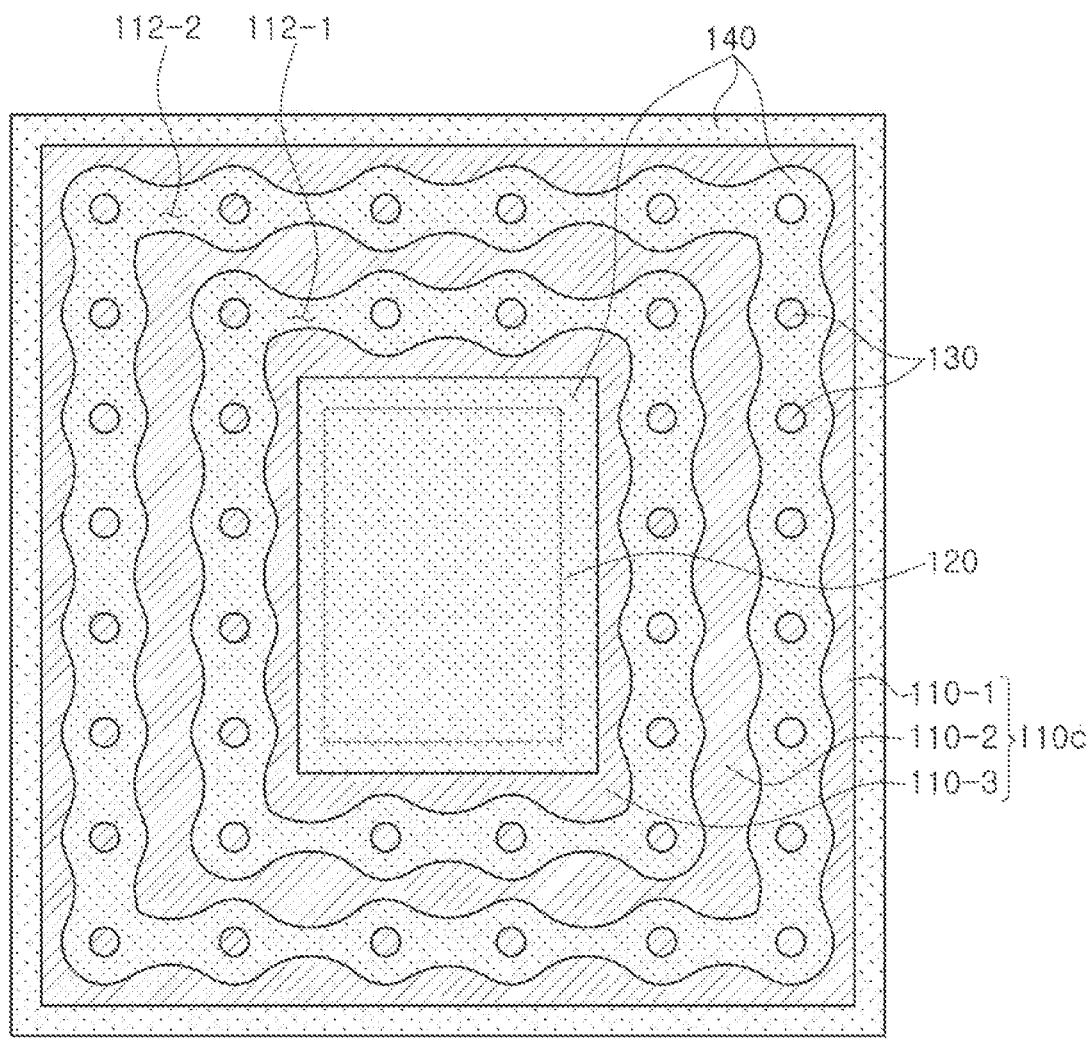

FIGS. 3A and 3B are plan views illustrating further embodiments of some components 110a of the semiconductor package 100A of FIG. 1.

Referring to FIG. 3A, a core member 110b according to a further embodiment may have a plurality of second through-holes respectively accommodating the plurality of vertical connection conductors 130, and a portion of each of second through-holes 112-1 and 112-2, disposed adjacent to each other, may be connected to each other. It is noted that FIG. 3A shows a portion of second through-holes 112-1 and 112-2 that are adjacent to each other vertically in FIG. 3A are connected to each other. However, embodiments are not limited thereto and in some embodiments, a portion of second through-holes that are adjacent to each other horizontally may be connected to each other. Therefore, in the embodiment illustrated in FIG. 3A, the core member 110b is omitted between the vertical connection conductors 130 disposed in the second through-holes 112-1 and 112-2 connected to each other, and the encapsulant 140 may be filled therebetween. The second through-holes 112-1 and 112-2, connected to each other, may secure sufficient space between the vertical connection conductors 130 to prevent the occurrence of voids in an embedding operation of the encapsulant 140.

Referring to FIG. 3B, a core member 110c of a further embodiment may include a first core member 110-1, a second core member 110-2, and a third core member 110-3 spaced apart from each other. A plurality of second through-holes may be connected to each other to form a first group 112-1 of second through-holes separating the third core member 110-3 and the second core member 110-2 and a second group 112-2 of second through-holes separating the second core member 110-2 and the first core member 110-1. The first to third core members 110-1, 110-2, and 110-3, spaced apart from each other, may perform different functions. For example, the first and second core members 110-1 and 110-2 may be connected to a ground pattern, and the third core member 110-3 may be connected to a power pattern.

Since other technical features of the components having the same reference numerals as those of FIG. 1, among the components illustrated in FIGS. 3A and 3B, are similar to those of the components illustrated in FIG. 1, description thereof will be omitted for conciseness.

Figure 4A:
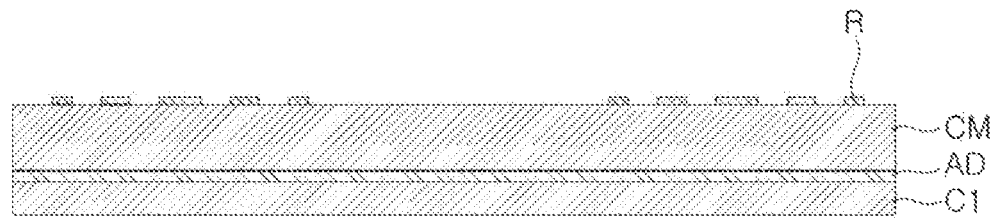
FIGS. 4A, 4B, and 5A to 7E are cross-sectional views illustrating a method of manufacturing the semiconductor package of FIG. 1, according to various embodiments.
Figure 4B:
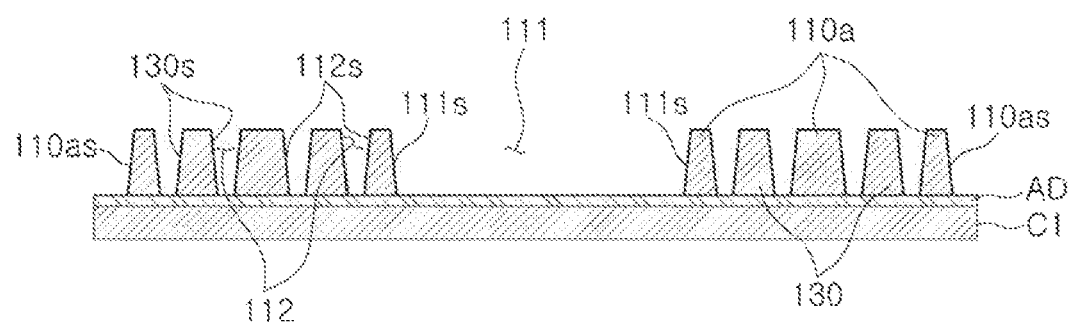
Figure 4C:
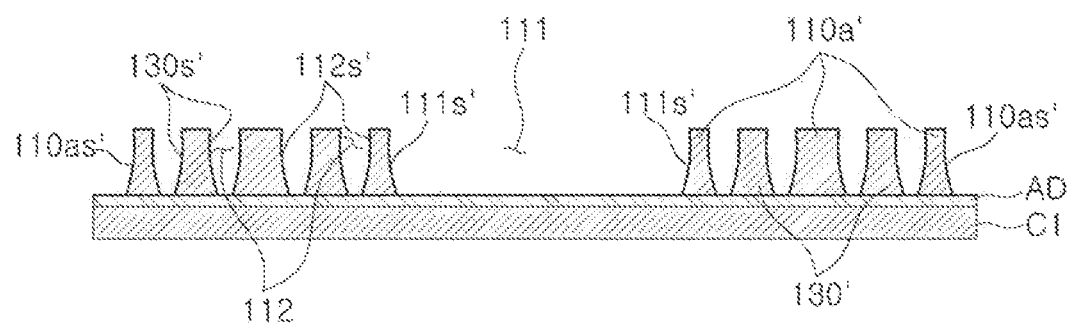
FIGS. 4C to 4E are cross-sectional views illustrating further embodiments of some components of the semiconductor package of FIG. 1, according to various embodiments.
Figure 4D:
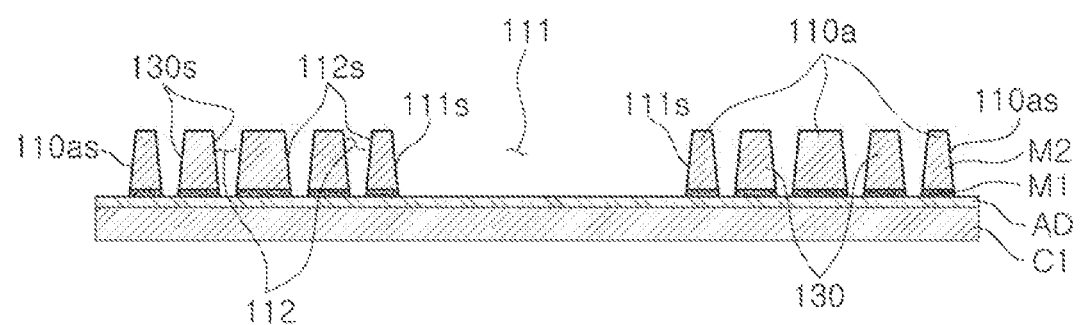
Figure 4E:
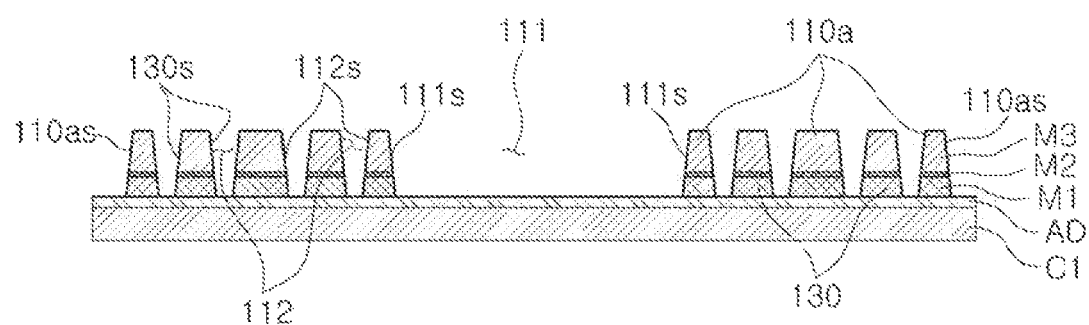

FIGS. 4A, 4B, and 5A to 7E are cross-sectional views illustrating a method of manufacturing the semiconductor package 100A of FIG. 1, according to various embodiments, and FIGS. 4C to 4E are cross-sectional views illustrating further embodiments of the components 110a and 130 of the semiconductor package 100A of FIG. 1.

Referring to FIGS. 4A to 4B, first, a core member 110a and a vertical connection conductor 130 may be formed. An adhesive layer AD and a metal plate CM may be formed on a first carrier C1, and a patterned etching resist R (e.g., a photoresist) may be formed to prepare first and second through-holes 111 and 112 and the vertical connection conductor 130 on the metal plate CM. The metal plate CM may be etched to form the core member 110a having the first and second through-holes 111 and 112 and the vertical connection conductor 130 located in the second through-hole 112. Therefore, an outer side surface 110as of the core member 110a may have a tapered cross-section toward an upper surface of the core member 110a, and side surfaces 130s of the vertical connection conductor 130 may have a tapered cross-section toward an upper surface of the vertical connection conductor 130. In addition, first and second side wall surfaces 111s and 112s of the first and second through-holes 111 and 112 may have a tapered cross-section toward lower ends of the through-holes 111 and 112, respectively. In this case, the upper and lower surfaces and the upper and lower ends may be terms used to describe tapering directions of side surfaces formed by an etching process, based on the drawings. Then, when upper and lower portions of the core member 110a are reversed in the manufacturing process of the package, the above-described "upper surface" may be described as "lower surface," and the above-described "upper end" may be described as "lower end," based on the related drawings.

The first carrier C1 may be a structure including an organic material. The metal plate CM may be a copper plate having a thickness corresponding to a thickness of the semiconductor chip. The adhesive layer AD may also include an organic material, but the material of the first carrier C1 and the material of the adhesive layer AD are not particularly limited.

Referring to FIG. 4C, in some embodiments, inner side surfaces (e.g., 111s' and 112s') and an outer side surface 110as' of a core member 110a' may have a concave vertical cross-sectional shape. Side surfaces 130s' of a vertical connection conductor 130' may have a concave vertical cross-sectional shape. Therefore, a first side wall surface 111s' of a first through-hole 111 may have a vertical cross-sectional shape that may be convex with respect to a center line of the first through-hole 111, and a second side wall surface 112s' of a second through-hole 112 may have a vertical cross-sectional shape that may be convex with respect to a center line of the second through-hole 112.

Referring to FIGS. 4D to 4E, the core member 110a and the vertical connection conductor 130 may include a plurality of metal layers. The plurality of metal layers may include different metal materials. As illustrated in the embodiment of FIG. 4D, the core member 110a and the vertical connection conductor 130 may include a first metal layer M1, and a second metal layer M2, respectively. When the second metal layer M2 includes copper, the first metal layer M1 may include other metal materials, for example, aluminum (Al), silver (Ag), and tin (Sn), gold (Au), nickel (Ni), lead (Pb), titanium (Ti), or alloys thereof. In this case, the first metal layer M1 may have a thickness of 200 nm or less. As illustrated in the embodiment of FIG. 4E, the core member 110a and the vertical connection conductor 130 may include a first metal layer M1, a second metal layer M2, and a third metal layer M3, respectively. In this case, the first metal layer M1 may have a thickness of 1 μm or less and the second metal layer M2 may have a thickness of 200 nm or less.

Figure 5A:
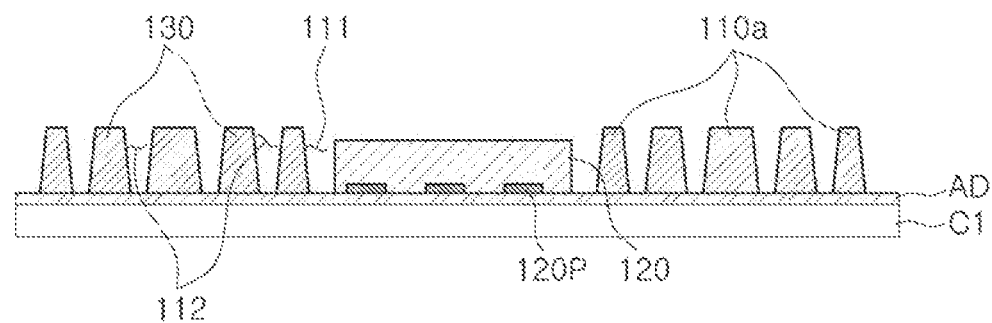
Figure 5B:
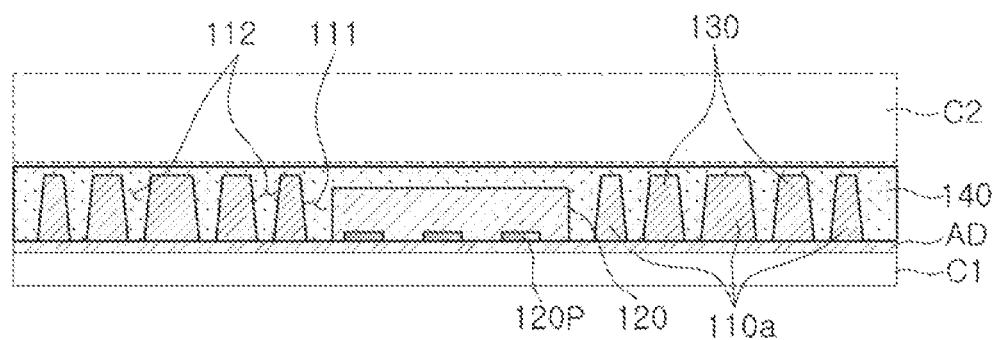

Referring to FIGS. 5A and 5B, a semiconductor chip 120 may be formed in the first through-hole 111 of the core member 110a, and an encapsulant 140 encapsulating the semiconductor chip 120 and the core member 110a may be formed. The semiconductor chip 120 may be disposed in the first through-hole 111 on the adhesive layer AD on which the core member 110a and the vertical connection conductor 130 are arranged. Thereafter, the encapsulant 140 may be formed to cover the outer side surface and the upper surface of the core member 110a and an upper surface of the semiconductor chip 120 and fill a space between the first through-hole 111 and the semiconductor chip 120 and a space between the second through-hole 112 and the vertical connection conductor 130. The encapsulant 140 may be ABF. Therefore, a lower surface of the vertical connection conductor 130, a lower surface of the core member 110a, and a lower surface of the encapsulant 140 may be on the same plane. Thereafter, a second carrier C2 may be attached to the encapsulant 140, and a redistribution substrate 150 may be formed on the lower surface of the encapsulant 140.

Figure 6A:
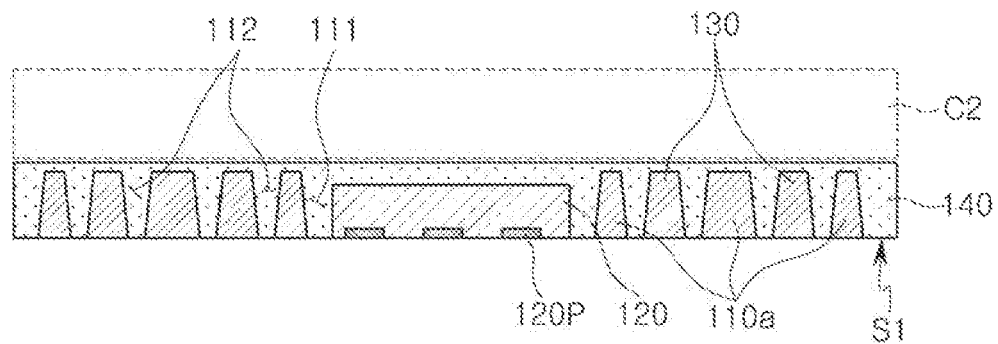
Figure 6B:
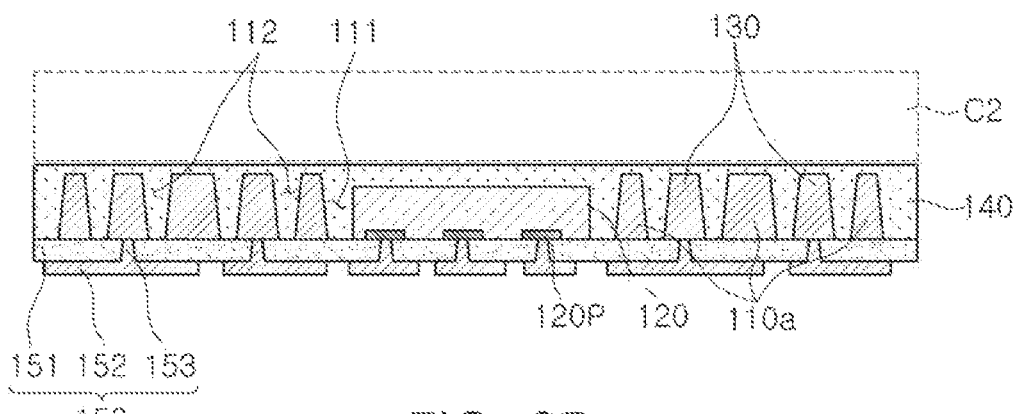
Figure 6C:
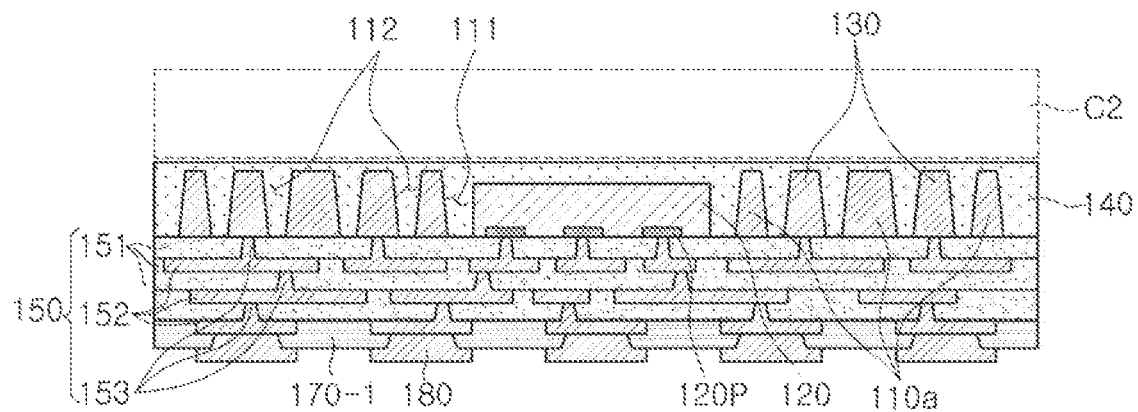

Referring to FIGS. 6A to 6C, a redistribution substrate 150 may be formed on a lower surface of the semiconductor chip 120. For example, the first carrier C1 of FIG. 5B may be removed, a first insulating layer 151 may be formed on a plane 51 including the lower surface of the semiconductor chip 120, the lower surface of the vertical connection conductor 130, the lower surface of the core member 110a, and the lower surface of the encapsulant 140, and a via hole passing through the first insulating layer 151, a first redistribution via 153 filling the via hole, and a first redistribution layer 152 on the first insulating layer may be formed. The first redistribution layer 152 and the first redistribution via 153 may be formed by a plating process. A photolithography process and a plating process may be repeated to form the redistribution substrate 150 including the insulating layer 151, the redistribution layer 152, and the redistribution via 153, as pluralities thereof. A first passivation layer 170-1 and an under-bump metal 180 may be formed below the redistribution substrate 150.

Referring to FIGS. 7A to 7E, a redistribution member 160 may be formed on the encapsulant 140. A lower surface of the first passivation layer 170-1 may be attached to a third carrier C3, and the second carrier C2 may be removed to expose an upper surface of the encapsulant 140. The first passivation layer 170-1 may be a solder resist. A first via hole 140h exposing a portion of the upper surface of the vertical connection conductor 130 may be formed on the upper surface of the encapsulant 140. A second insulating layer 161 covering the upper surface of the encapsulant 140 and filling the first via hole 140h may be formed, and a second via hole 161h passing through the second insulating layer 161 to open a portion of the upper surface of the vertical connection conductor 130 in the first via hole 140h may be formed. A second redistribution via 163 filling the second via hole 161h, and a second redistribution layer 162 may be formed. The first via hole 140h may be formed by a laser drill, and the second via hole 161h may be formed by a photolithography process. The second redistribution layer 162 and the second redistribution via 163 may be formed by a plating process. A second passivation layer 170-2 having an opening exposing a portion of the second redistribution layer 162 may be formed on the redistribution member 160. The second passivation layer 170-2 may be a solder resist. Thereafter, the semiconductor package may be completed by removing the third carrier C3 and forming a connection bump covering the under-bump metal 180.

Figure 8:
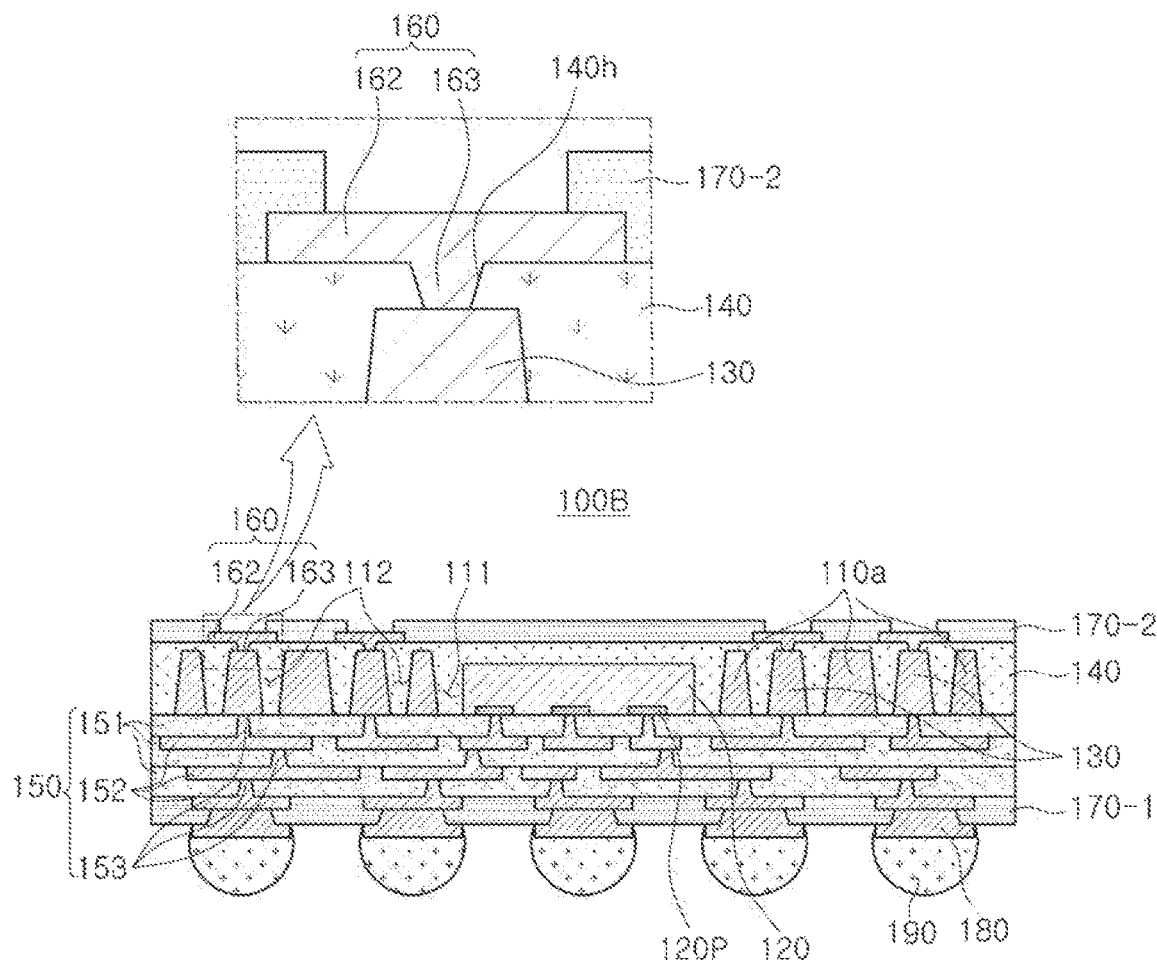
FIGS. 8 to 9B are cross-sectional views schematically illustrating a semiconductor package and a portion of a method of manufacturing the same according to a further embodiment.
Figure 9A:
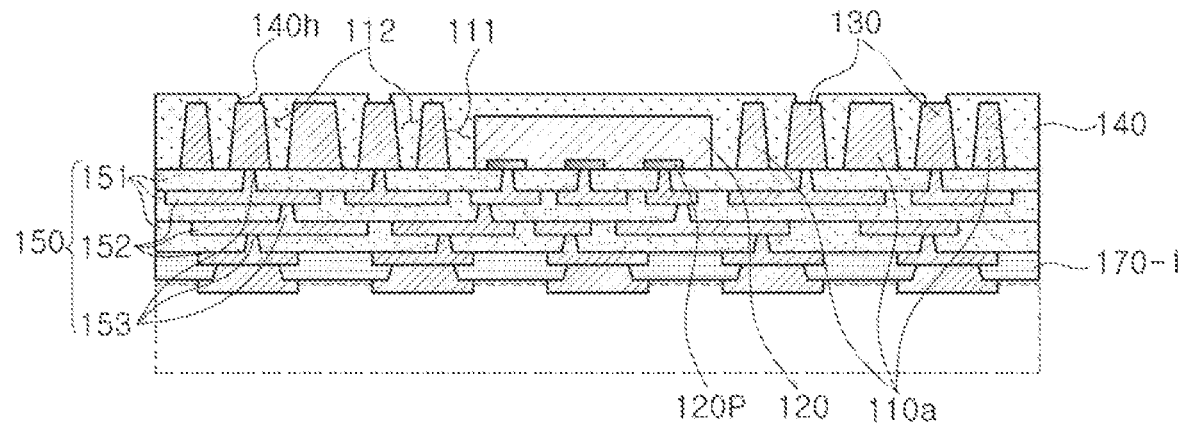
Figure 9B:
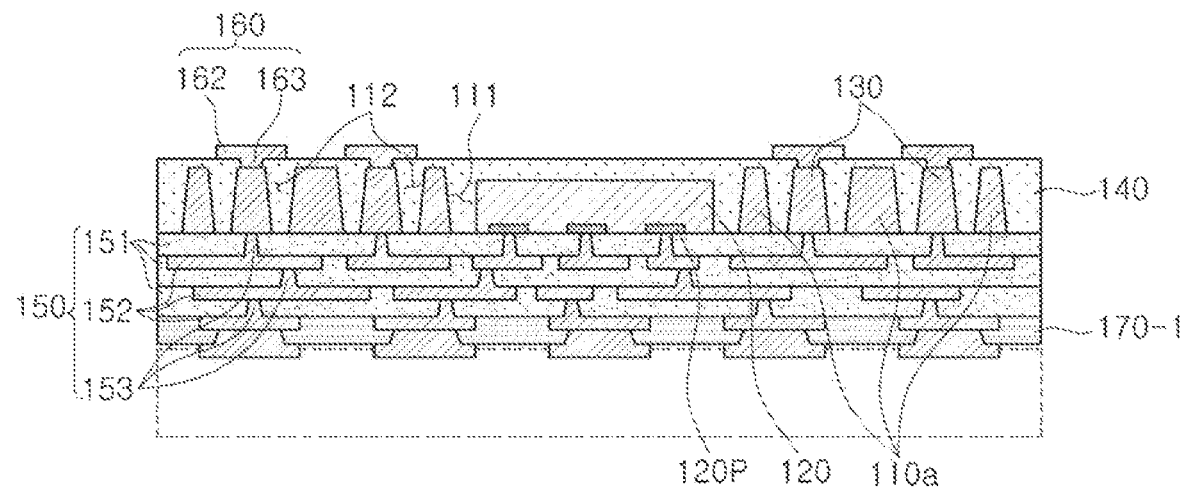

FIGS. 8 to 9B are cross-sectional views schematically illustrating a semiconductor package 100B and a portion of a method of manufacturing the same according to a further embodiment.

Referring to FIG. 8, in a semiconductor package 100B, an encapsulant 140 may have a first via hole 140h exposing a portion of an upper surface of a vertical connection conductor 130, and a redistribution member 160 may include a redistribution layer 162 disposed directly on an upper surface of the encapsulant 140, and the redistribution via 163 filling the first via hole 140h and connecting the second redistribution layer 162 and the vertical connection conductor 130.

Figure 7A:
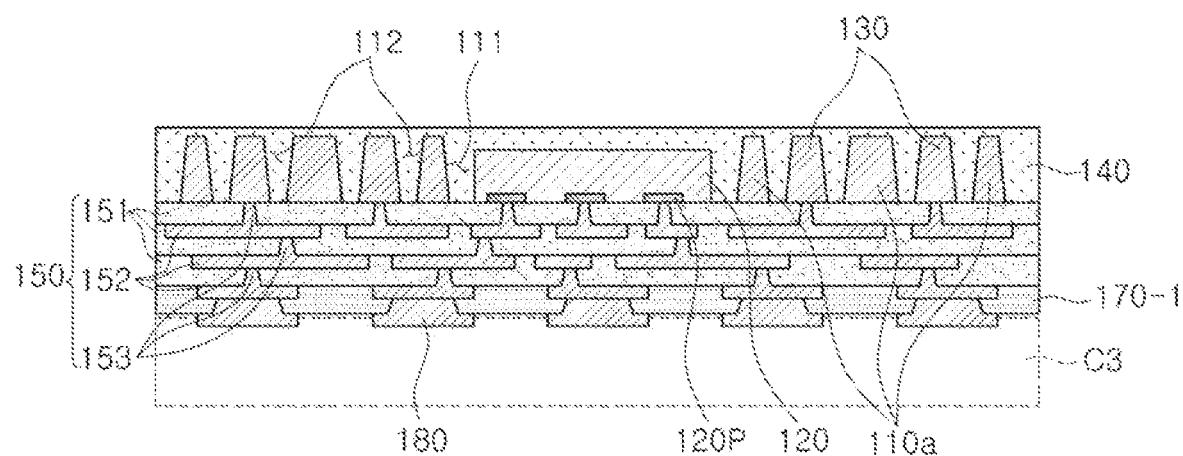
Figure 7B:
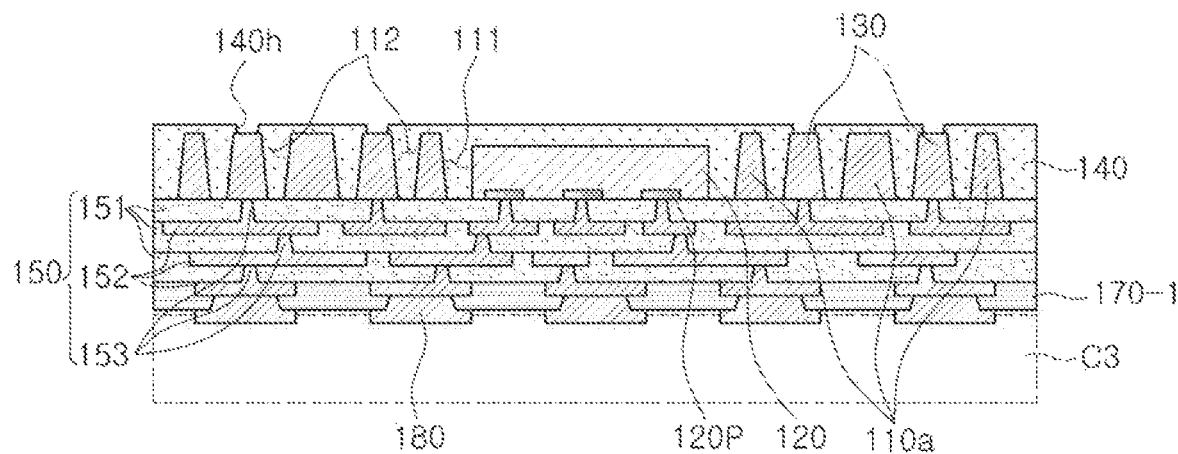
Figure 7C:
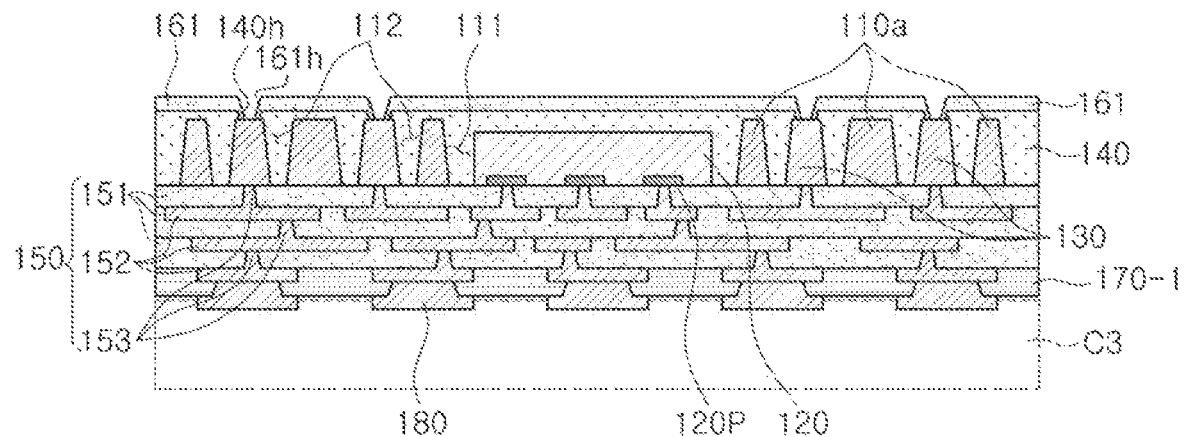
Figure 7D:
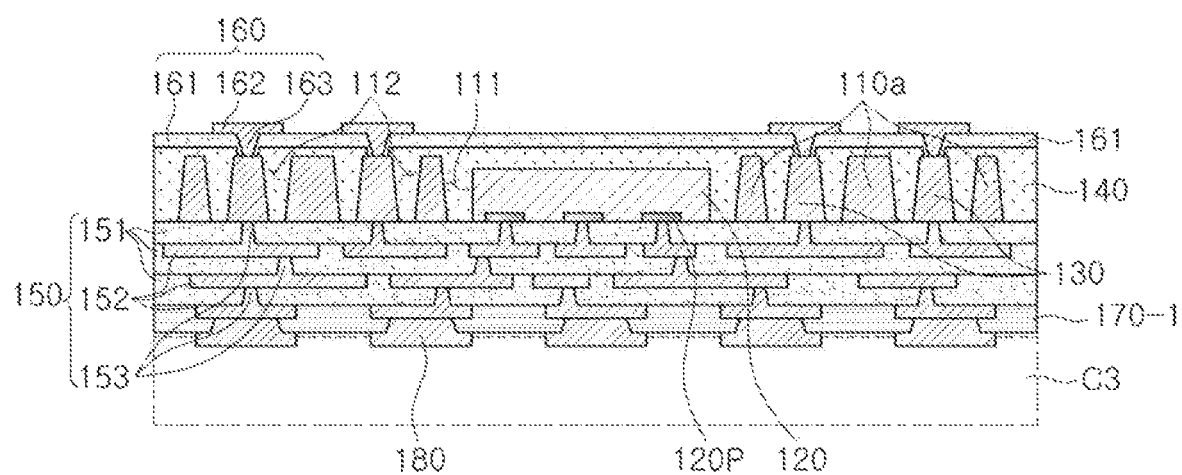
Figure 7E:
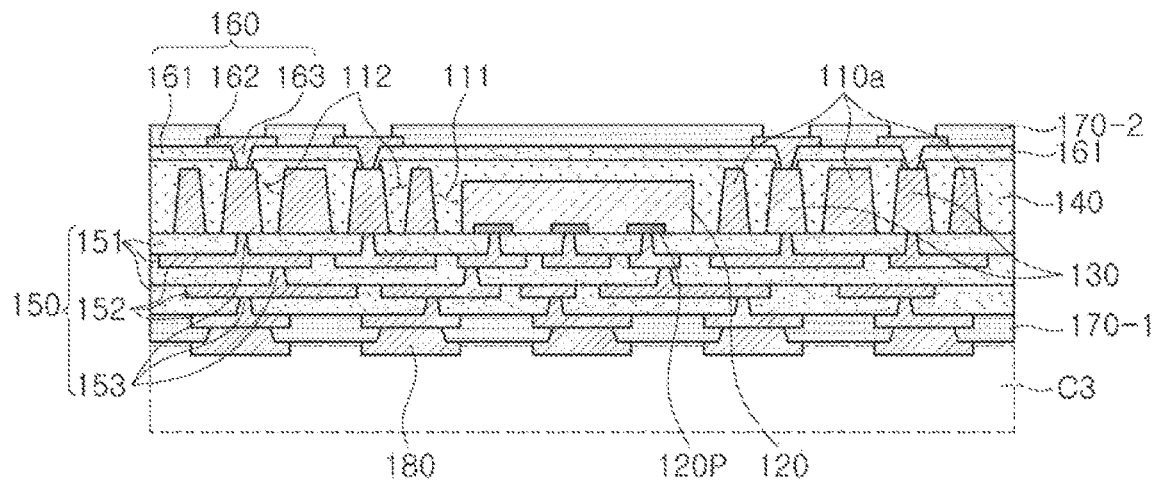

Referring to FIGS. 9A and 9B, similarly to FIG. 7B, a first via hole 140h may be formed in an upper portion of an encapsulant 140, and a second redistribution via 163 filling the first via hole 140h, and a second redistribution layer 162 connected to the second redistribution via 163 and extending along an upper surface of the encapsulant 140 may be formed, without forming a separate insulating layer. Therefore, since an operation of forming a second via hole may be omitted, an electrical connection path may be shortened.

Since other technical features of the components having the same reference numerals as those of FIG. 1, among the components illustrated in FIGS. 8 to 9B, are similar to those of the components illustrated in FIG. 1, description thereof will be omitted for conciseness.

Figure 10:
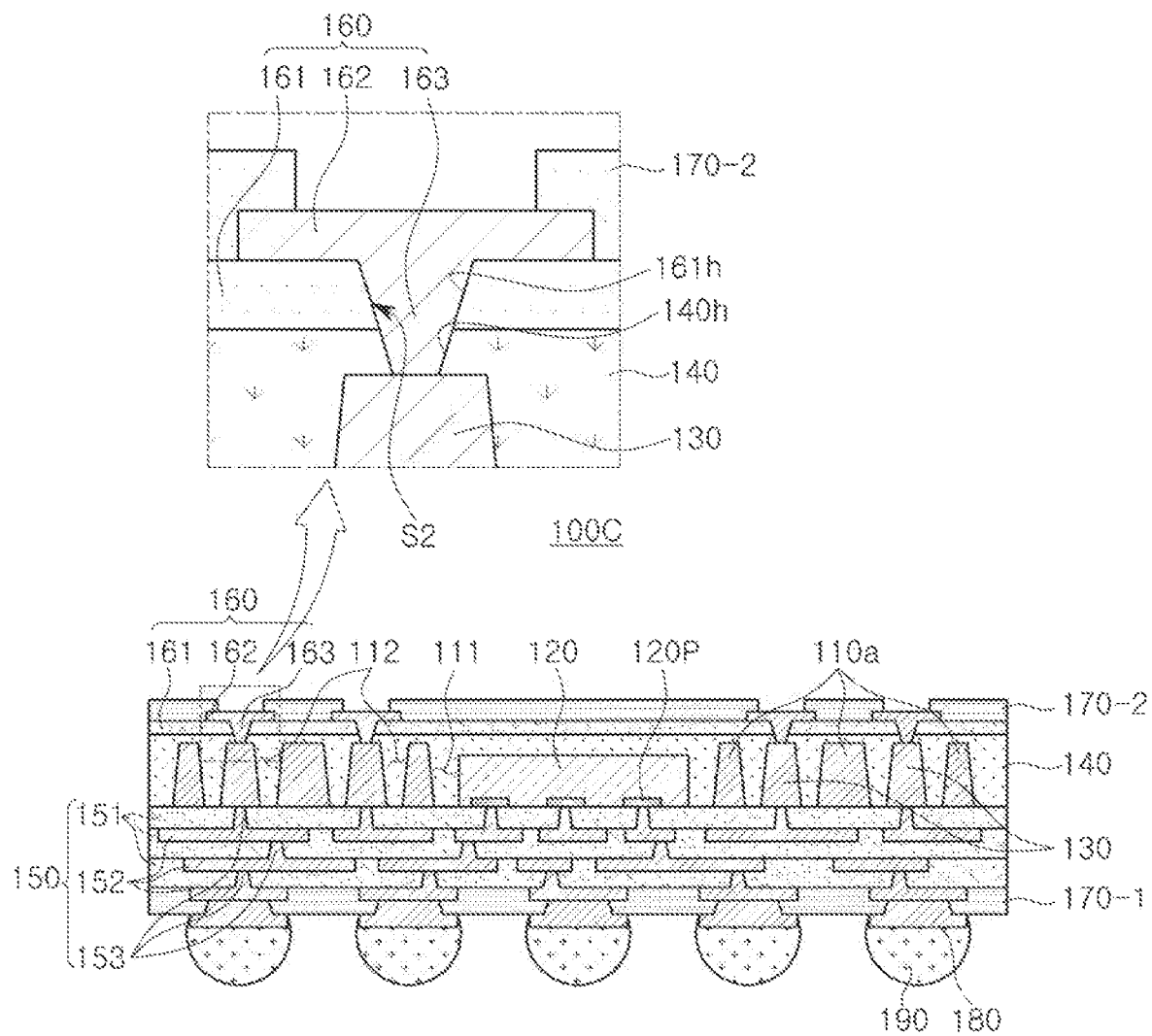
FIGS. 10 to 11C are cross-sectional views schematically illustrating a semiconductor package and a portion of a method of manufacturing the same, according to a further embodiment.
Figure 11A:
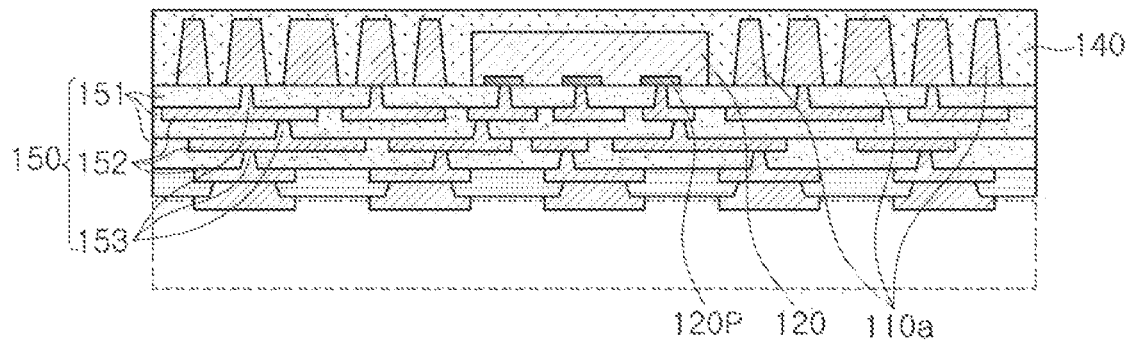
Figure 11B:
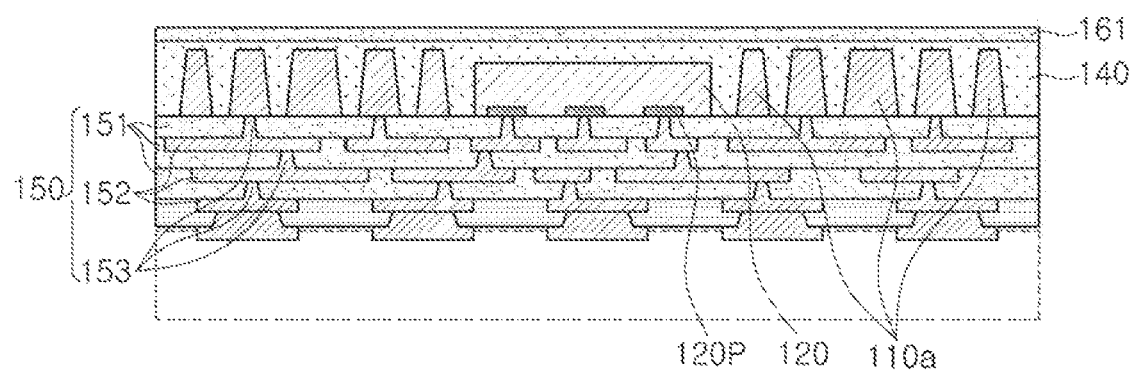
Figure 11C:
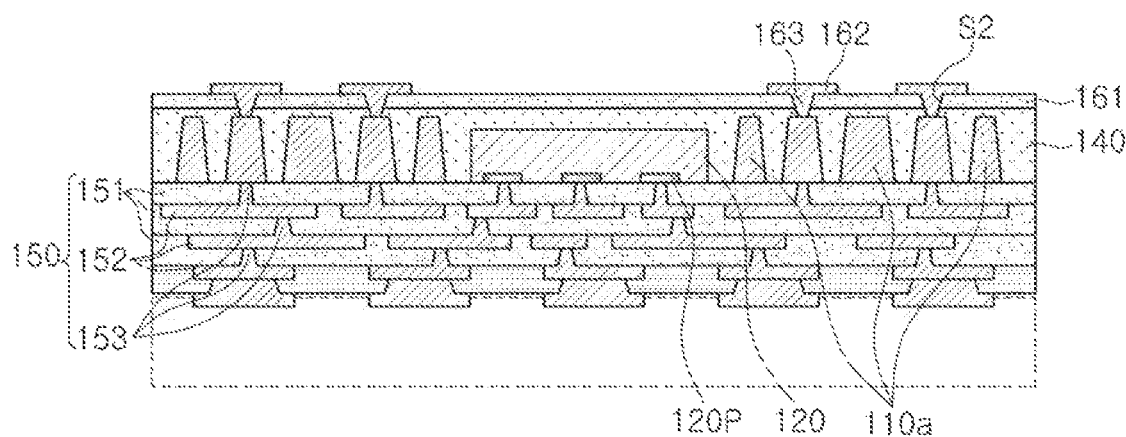

FIGS. 10 to 11C are cross-sectional views schematically illustrating a semiconductor package 100C and a portion of a method of manufacturing the same according to a further embodiment.

Referring to FIG. 10, in a semiconductor package 100C, an encapsulant 140 may have a first via hole 140h exposing a portion of an upper surface of a vertical connection conductor 130, and a redistribution member 160 may include a second insulating layer 161 on an upper surface of the encapsulant 140 and having a second via hole 161h connected to the first via hole 140h, a redistribution layer 162 disposed directly on the upper surface of the encapsulant 140, and the redistribution via 163 filling the first and second via holes 140h and 161h and connecting the second redistribution layer 162 and the vertical connection conductor 130, wherein side wall surfaces of the first and second via holes 140h and 161h may be on the same plane S2. The encapsulant 140 may include the same material as the second insulating layer 161. For example, the encapsulant 140 and the second insulating layer 161 may both include a PID resin. Therefore, since the first via hole 140h and the second via hole 161h may be simultaneously formed, an operation of forming a laser via (140h of FIG. 7B) passing through the encapsulant 140 may be omitted.

Referring to FIGS. 11A to 11C, similarly to FIGS. 7A to 7E, a redistribution member 160 may be formed. Since an encapsulant 140 and a second insulating layer 161 include the same insulating material, a first via hole 140h passing through the encapsulant 140 and a second via hole 161h passing through the second insulating layer 161 may be formed by the same process. When both of the encapsulant 140 and the second insulating layer 161 include a PID resin, the first via hole 140h and the second via hole 161h may be photo vias connected to have a single shape, and side wall surfaces of the first and second via holes 140h and 161h may be on the same plane S2.

Since other technical features of the components having the same reference numerals as those of FIG. 1, among the components illustrated in FIGS. 10 to 11C, are similar to those of the components illustrated in FIG. 1, description thereof will be omitted for conciseness.

Figure 12:
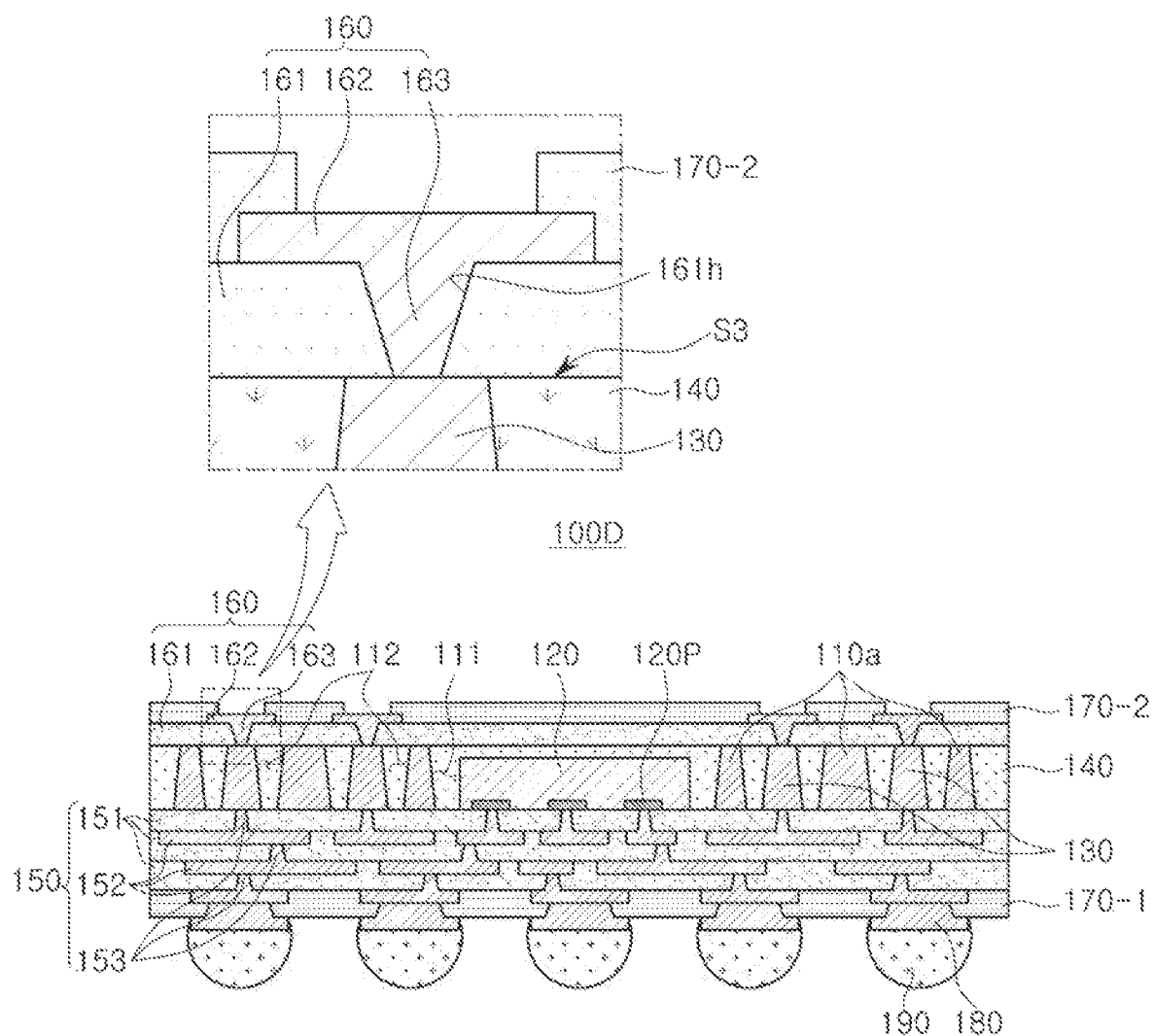
FIG. 12 is a cross-sectional view illustrating a semiconductor package according to a further embodiment.

FIG. 12 is a cross-sectional view illustrating a semiconductor package according to a further embodiment.

Referring to FIG. 12, in a semiconductor package 100D, an upper surface of an encapsulant 140 may be on the same plane S3 as an upper surface of a vertical connection conductor 130 and an upper surface of a core member 110a, and a redistribution member 160 may include an insulating layer 161 disposed on the same plane S3 and having a via hole 161h exposing a portion of the upper surface of the vertical connection conductor 130, a second redistribution layer 162 on the insulating layer 161, and a redistribution via 163 filling the via hole 161h and connecting the second redistribution layer 162 and the vertical connection conductor 130.

The plane S3 including the upper surface of the encapsulant 140, the upper surface of the vertical connection conductor 130, and the upper surface of the core member 110a may be formed by forming the encapsulant 140 of FIG. 7A, and performing a planarization process to expose the upper surface of the vertical connection conductor 130 and the upper surface of the core member 110a. Therefore, since an operation of forming a laser via (140h of FIG. 7B) passing through the encapsulant 140 may be omitted, a vertical connection path may be shortened.

Since other technical features of the components having the same reference numerals as those of FIG. 1, among the elements illustrated in FIG. 12, are similar to those of the elements illustrated in FIG. 1, description thereof will be omitted for conciseness.

Figure 13:
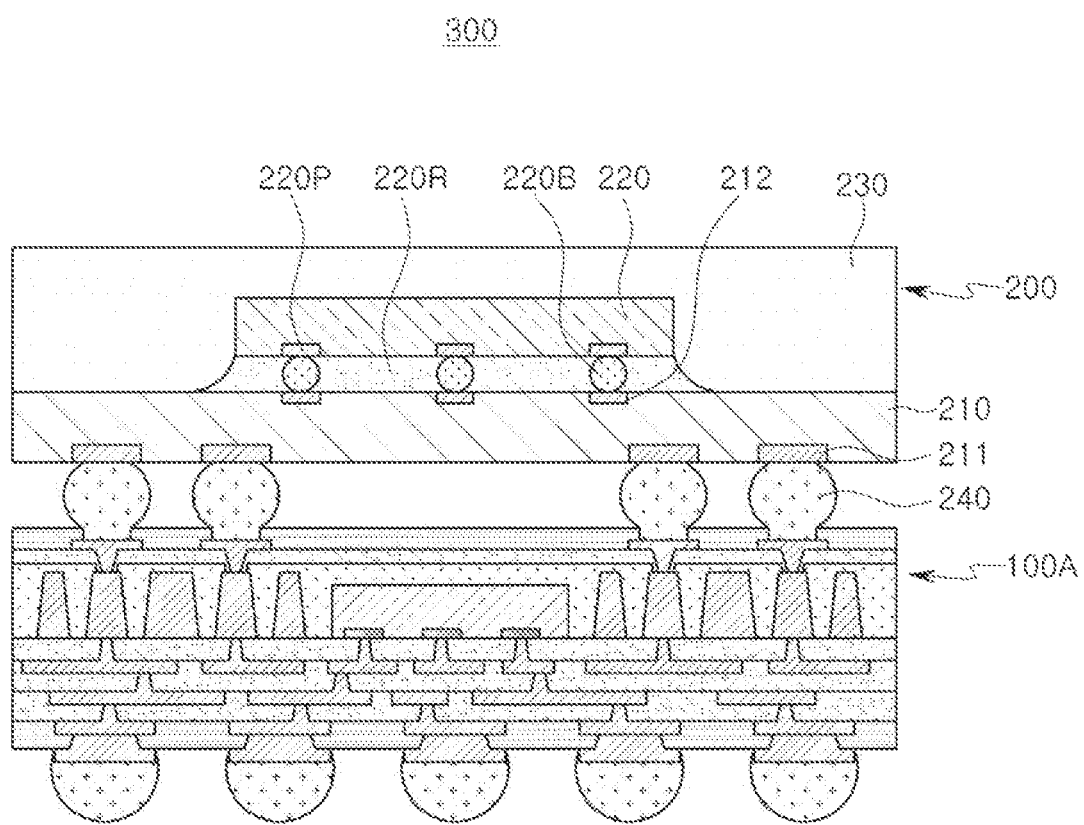
FIG. 13 is a cross-sectional view of a semiconductor package according to a further embodiment.

FIG. 13 is a cross-sectional view of a semiconductor package according to a further embodiment.

Referring to FIG. 13, a semiconductor package 300 may have a package-on-package structure in which a second semiconductor package 200 is coupled to the semiconductor package 100A of FIG. 1. The second package 200 may include a second redistribution substrate 210, a second semiconductor chip 220, and a second encapsulant 230.

The second redistribution substrate 210 may include redistribution pads 211 and 212 having lower and upper surfaces electrically connected to external components, respectively, and may include redistribution patterns (not shown) connected to the redistribution pads 211 and 212 therein. The redistribution patterns may redistribute a connection pad of the second semiconductor chip 220 as a fan-out region.

The second semiconductor chip 220 may include a connection pad 220P connected to an integrated circuit therein, and the connection pad 220P may be electrically connected to the second redistribution substrate 210 by a metal bump 220B. In an example, the second package 200 may further include an underfill material 220R surrounding the metal bump 220B. The underfill material 220R may be an insulating material including an epoxy resin or the like. The metal bump 220B may include a solder balls or a copper pillar.

Unlike in the drawings, in some embodiments, the connection pad 220P of the second semiconductor chip 220 may be directly in contact with an upper surface of the second redistribution substrate 210, and may be electrically connected to the redistribution patterns by a via in the second redistribution substrate 210.

The second encapsulant 230 may include a material that may be the same as or similar to that of the encapsulant 140 of the semiconductor package 100A.

The second package 200 may be physically/electrically connected to the semiconductor package 100A by a second connection bump 240. The second connection bumps 240 may be electrically connected to the redistribution patterns in the second redistribution substrate 210 by the redistribution pads 211 on a lower surface of the second redistribution substrate 210. Alternatively, in some embodiments, the redistribution patterns may be electrically connected to each other by an under-bump metal disposed on the redistribution pad 211 on the lower surface of the second redistribution substrate 210. The second connection bumps 240 may be made of a low melting-point metal, for example, tin (Sn) or an alloy including tin (Sn).

Since other technical features of the components having the same reference numerals as those of FIG. 1, among the elements illustrated in FIG. 13, are similar to those of the elements illustrated in FIG. 1, description thereof will be omitted for conciseness.

According to various embodiments, a core member and a vertical connection conductor formed by processing one metal plate may produce a semiconductor package with a structure having excellent stiffness and improved warpage and heat dissipation characteristics.

While example embodiments have been illustrated and described above, it will be apparent to those skilled in the art that modifications and variations could be made without departing from the scope of the present disclosure as defined by the appended claims.

What is claimed is:

1. A semiconductor package comprising:
a redistribution substrate including a first redistribution layer;
a semiconductor chip on the redistribution substrate and having a connection pads electrically connected to the first redistribution layer;
a plurality of vertical connection conductors disposed around the semiconductor chip, the plurality of vertical connection conductors being electrically connected to the connection pads by the first redistribution layer;
a core member on the redistribution substrate, the core member continuously extending between the semiconductor chip and the plurality of vertical connection conductors, and the core member defining a first through-hole surrounding a side surface of the semiconductor chip, and a plurality of second through-holes surrounding side surfaces of the plurality of vertical connection conductors, respectively;
an encapsulant on the redistribution substrate, covering the semiconductor chip and the plurality of vertical connection conductors; and
a redistribution member on the encapsulant, and including a second redistribution layer electrically connected to the plurality of vertical connection conductors,
wherein the first redistribution layer includes a first signal pattern, a first power pattern, and a first ground pattern,
wherein the core member is electrically connected to the first ground pattern of the first redistribution layer,
wherein the plurality of vertical connection conductors each comprise a plurality of connecting metal layers including different metals,
wherein the core member comprises a plurality of core metal layers including different metals, and
wherein any one of the plurality of connecting metal layers comprises a same metal as any one of the plurality of core metal layers disposed at a same level.

2. The semiconductor package according to claim 1, wherein the second redistribution layer includes a second signal pattern, a second power pattern, and a second ground pattern, and
wherein at least one of the plurality of vertical connection conductors is electrically connected to the second redistribution layer.

3. The semiconductor package according to claim 1, wherein the plurality of vertical connection conductors are insulated from the core member.

4. The semiconductor package according to claim 1, wherein each of the plurality of vertical connection conductors has a vertical cross-sectional shape in which the side surface of each of the plurality of vertical connection conductors is tapered.

5. The semiconductor package according to claim 1, wherein each of the plurality of vertical connection conductors has a vertical cross-sectional shape in which the side surface of each of the plurality of vertical connection conductors is concave.

6. The semiconductor package according to claim 1, wherein lower surfaces of the plurality of vertical connection conductors, a lower surface of the core member, and a lower surface of the encapsulant are coplanar with each other.

7. The semiconductor package according to claim 6, wherein the redistribution substrate further comprises a first insulating layer covering the lower surfaces of the plurality of vertical connection conductors, and a first redistribution via passing through the first insulating layer to connect the first redistribution layer and the lower surfaces of the plurality of vertical connection conductors.

8. The semiconductor package according to claim 1, wherein upper surfaces of the plurality of vertical connection conductors and an upper surface of the core member are on a higher level than an upper surface of the semiconductor chip.

9. The semiconductor package according to claim 8, wherein an upper surface of the encapsulant is on a higher level than the upper surfaces of the plurality of vertical connection conductors and the upper surface of the core member.

10. The semiconductor package according to claim 1, wherein a width of an upper portion of the first through-hole is greater than a width of a lower portion of the first through-hole.

11. The semiconductor package according to claim 1, wherein a width of an upper portion of each of the plurality of second through-holes is greater than a width of a lower portion of each of the plurality of second through-holes.

12. The semiconductor package according to claim 1, wherein a width of an upper portion of each of the plurality of vertical connection conductors is smaller than a width of a lower portion of each of the plurality of vertical connection conductors.

13. The semiconductor package according to claim 1, wherein, on a plane, each of the plurality of vertical connection conductors has a circular shape, and
each of the plurality of second through-holes has a circular shape.

14. The semiconductor package according to claim 1, wherein, on a plane, each of the plurality of vertical connection conductors has a rectangular shape, and
each of the plurality of second through-holes has a rectangular shape.

15. The semiconductor package according to claim 1, wherein the core member has a thickness greater than or equal to a thickness of the semiconductor chip.

16. A semiconductor package comprising:
a redistribution substrate including a first redistribution layer;
a semiconductor chip on the redistribution substrate and having connection pads electrically connected to the first redistribution layer;
a plurality of vertical connection conductors around the semiconductor chip, the plurality of vertical connection conductors being electrically connected to the connection pads by the first redistribution layer;
a core member continuously extending between the semiconductor chip and the plurality of vertical connection conductors;
an encapsulant on the redistribution substrate, covering the semiconductor chip and the plurality of vertical connection conductors; and
a redistribution member on the encapsulant, and including a second redistribution layer electrically connected to the plurality of vertical connection conductors,
wherein the first redistribution layer includes a signal pattern, a power pattern, and a ground pattern,
wherein the core member is electrically connected to at least one of the connection pads of the semiconductor chip and to the ground pattern of the first redistribution layer,
wherein the plurality of vertical connection conductors each comprise a plurality of connecting metal layers including different metals, wherein the core member comprises a plurality of core metal layers including different metals, and wherein any one of the plurality of connecting metal layers comprises a same metal as any one of the plurality of core metal layers disposed at a same level.

17. The semiconductor package according to claim 16, wherein the plurality of vertical connection conductors are electrically connected to at least one of the connection pads of the semiconductor chip through the signal pattern of the first redistribution layer.

18. The semiconductor package according to claim 16, wherein the connection pads of the semiconductor chip are electrically connected to at least one of the signal pattern, the power pattern, and the ground pattern of the first redistribution layer.

19. A semiconductor package comprising:

a redistribution substrate including a redistribution layer;

a semiconductor chip on the redistribution substrate and having connection pads electrically connected to the redistribution layer;

a plurality of vertical connection conductors around the semiconductor chip, the plurality of vertical connection conductors being electrically connected to the redistribution layer; and a core member continuously extending on the redistribution substrate to surround side surfaces of the plurality of vertical connection conductors, wherein the core member is electrically connected to at least one of the connection pads of the semiconductor chip and to a ground pattern of the redistribution layer, wherein the plurality of vertical connection conductors each comprise a plurality of connecting metal layers including different metals, wherein the core member comprises a plurality of core metal layers including different metals, and wherein any one of the plurality of connecting metal layers comprises a same metal as any one of the plurality of core metal layers disposed at a same level.

20. The semiconductor package according to claim 19, wherein the plurality of vertical connection conductors are insulated from the core member.

\* \* \* \* \*